(12) United States Patent
Anas et al.

(10) Patent No.: US 11,355,536 B2
(45) Date of Patent: Jun. 7, 2022

(54) IMAGE SENSOR, SIGNAL PROCESSING DEVICE, SIGNAL PROCESSING METHOD, AND ELECTRONIC DEVICE

(71) Applicant: Sony Semiconductor Solutions Corporation, Kanagawa (JP)

(72) Inventors: Bostamam Anas, Kanagawa (JP); Katsuhiko Hanzawa, Kanagawa (JP); Shinichiro Futami, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 404 days.

(21) Appl. No.: 16/383,441

(22) Filed: Apr. 12, 2019

(65) Prior Publication Data

US 2020/0020726 A1 Jan. 16, 2020

Related U.S. Application Data

(60) Provisional application No. 62/696,935, filed on Jul. 12, 2018.

(51) Int. Cl.
| | |
|---|---|
| *H01L 27/146* | (2006.01) |
| *H04N 5/232* | (2006.01) |
| *H04N 5/341* | (2011.01) |
| *H04N 5/3745* | (2011.01) |

(52) U.S. Cl.
CPC ... *H01L 27/14605* (2013.01); *H04N 5/23245* (2013.01); *H04N 5/341* (2013.01); *H04N 5/37455* (2013.01)

(58) Field of Classification Search
CPC .......... H01L 27/14605; H04N 5/23245; H04N 5/341; H04N 5/37455; H04N 5/35518; H04N 5/345; H04N 5/378; H04N 5/3655

USPC ........................................................ 348/294
See application file for complete search history.

(56) References Cited

U.S. PATENT DOCUMENTS

| | | | | |
|---|---|---|---|---|
| 2011/0037868 A1* | 2/2011 | Ota | ...................... | H04N 5/3742 348/222.1 |
| 2013/0250148 A1* | 9/2013 | Park | ...................... | H04N 5/217 348/241 |
| 2018/0324416 A1* | 11/2018 | Kim | ...................... | H04N 5/378 |
| 2019/0268559 A1* | 8/2019 | Kondo | .................... | H04N 5/369 |

FOREIGN PATENT DOCUMENTS

JP 2012-244372 A 12/2012

* cited by examiner

*Primary Examiner* — Lin Ye
*Assistant Examiner* — Chan T Nguyen
(74) *Attorney, Agent, or Firm* — Wolf, Greenfield & Sacks, P.C.

(57) ABSTRACT

[Object] To execute online calibration without using a light source.

[Solution] An image sensor includes: a pixel array portion in which a plurality of pixels are disposed and which generates a pixel signal; a reference signal generation unit configured to generate a reference signal for calibration; an analog digital (AD) conversion unit configured to execute AD conversion on the pixel signal and the reference signal to generate pixel data and reference data; and a correction processing unit configured to correct the pixel data on a basis of the reference data. The present technology can be applied to, for example, an image sensor performing online calibration.

18 Claims, 31 Drawing Sheets

|  | iL | iM | iH |
|---|---|---|---|
| PIXEL BLOCK PB1 | YL1 | YM1 | YH1 |
| PIXEL BLOCK PB2 | YL2 | YM2 | YH2 |
| ⋮ | ⋮ | ⋮ | ⋮ |
| PIXEL BLOCK PBn | YLn | YMn | YHn |

IMAGE SENSOR, SIGNAL PROCESSING DEVICE, SIGNAL PROCESSING METHOD, AND ELECTRONIC DEVICE

CROSS REFERENCE TO RELATED APPLICATIONS

This Application claims priority under 35 U.S.C. § 119(e) to U.S. Provisional Application Ser. No. 62/696,935, entitled "IMAGING DEVICE, SIGNAL PROCESSING DEVICE, SIGNAL PROCESSING METHOD, AND ELECTRONIC DEVICE," filed on Jul. 12, 2018, which is herein incorporated by reference in its entirety.

TECHNICAL FIELD

The present technology relates to an image sensor, a signal processing device, a signal processing method, and an electronic device, and more particularly, to an image sensor, a signal processing device, a signal processing method, and an electronic device performing online calibration.

BACKGROUND ART

In the related art, solid-state imaging devices that execute processes of calculating inflection points of all pixels using contained light sources and execute online calibration of correcting pixel signals using the calculated inflection points in a case in which conditions for causing changes in photoelectric conversion characteristics of image sensors are satisfied have been proposed (for example, see Patent Literature 1).

CITATION LIST

Patent Literature

Patent Literature 1: JP 2012-244372A

DISCLOSURE OF INVENTION

Technical Problem

However, when a light source is contained in a solid-state device, the size, power consumption, and cost of the device may increase.

The present technology is devised in view of such circumstances and enables online calibration to be executed without using a light source.

Solution to Problem

An image sensor according to a first aspect of the present technology includes: a pixel array portion in which a plurality of pixels are disposed and which generates a pixel signal; a reference signal generation unit configured to generate a reference signal for calibration; an analog digital (AD) conversion unit configured to execute AD conversion on the pixel signal and the reference signal to generate pixel data and reference data; and a correction processing unit configured to correct the pixel data on a basis of the reference data.

A signal processing device according to a second aspect of the present technology includes: a correction processing unit configured to correct pixel data obtained when an analog digital (AD) conversion unit executes AD conversion on a pixel signal generated by a pixel array portion in which a plurality of pixels are disposed, on a basis of reference data obtained when the AD conversion unit executes the AD conversion on a reference signal for calibration.

A signal processing method according to the second aspect of the present technology includes: correcting pixel data obtained when an analog digital (AD) conversion unit executes AD conversion on a pixel signal generated by a pixel array portion in which a plurality of pixels are disposed, on a basis of reference data obtained when the AD conversion unit executes the AD conversion on a reference signal for calibration.

An electronic device according to a third aspect of the present technology includes: an image sensor; and a signal processing unit configured to process a signal output from the image sensor. The image sensor includes a pixel array portion in which a plurality of pixels are disposed and which generates a pixel signal, a reference signal generation unit configured to generate a reference signal for calibration, an analog digital (AD) conversion unit configured to execute AD conversion on the pixel signal and the reference signal to generate pixel data and reference data, and a correction processing unit configured to correct the pixel data on a basis of the reference data.

In the first aspect of the present technology, the pixel signal is generated, the reference signal for calibration is generated, the pixel signal and the reference signal are subjected to the analog digital (AD) conversion to generate the pixel data and the reference data, and the pixel data is corrected on the basis of the reference data.

In the second aspect of the present technology, pixel data obtained when an analog digital (AD) conversion unit executes AD conversion on a pixel signal generated by a pixel array portion in which a plurality of pixels are disposed is corrected, on a basis of reference data obtained when the AD conversion unit executes the AD conversion on a reference signal for calibration.

In the third aspect of the present technology, the signal output from the image sensor is processed and the pixel signal is generated in the image sensor, the reference signal for calibration is generated, the pixel signal and the reference signal are subjected to the analog digital (AD) conversion to generate the pixel data and the reference data, and the pixel data is corrected on the basis of the reference data.

Advantageous Effects of Invention

According to the first to third aspects of the present technology, it is possible to execute the online calibration without using a light source.

Note that the advantageous effects described in the present specification are merely exemplary and advantageous effects of the present technology are not limited to the advantageous effects described in the present specification but additional advantageous effects may be achieved.

BRIEF DESCRIPTION OF DRAWINGS

FIG. 4 is a diagram illustrating a configuration example of a pixel array portion, an analog signal processing unit, and an AD conversion unit.

FIG. 17 is a diagram illustrating an example of a reference signal characteristic table.

MODE(S) FOR CARRYING OUT THE INVENTION

Hereinafter, a mode for carrying out the present technology (hereinafter referred to as embodiments) will be described. Note that the description thereof will be made in the following order.
1. First Embodiment
2. Second Embodiment
3. Third Embodiment
4. Fourth Embodiment
5. Modification example
6. Application example of present technology 1. First Embodiment First, a first embodiment of the present technology will be described with reference to FIGS. 1 to 22.
<Configuration Example of Imaging Device 100>

Figure 1:
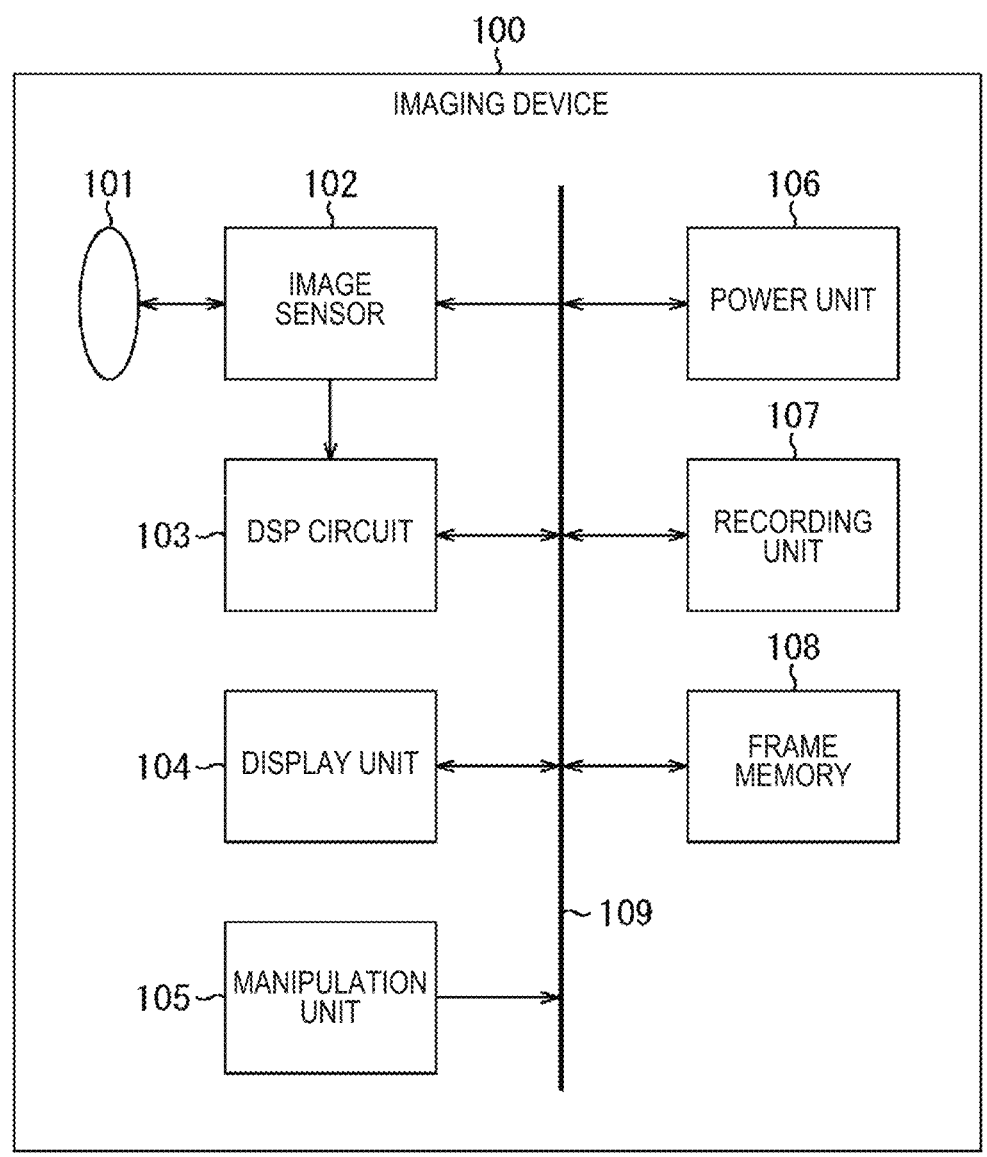
FIG. 1 is a block diagram illustrating a configuration example of an imaging device to which the present technology is applied.

FIG. 1 is a block diagram illustrating a configuration example of an imaging device 100 which is an embodiment of an electronic device to which the present technology is applied.

As the imaging device 100, for example, an information processing device, a smartphone, a digital camera, or the like that has an imaging function is assumed.

The imaging device 100 includes an optical unit 101, an image sensor 102, a digital signal processor (DSP) circuit 103, a display unit 104, a manipulation unit 105, a power unit 106, a recording unit 107, a frame memory 108, and a bus 109. The image sensor 102, the DSP circuit 103, the display unit 104, the manipulation unit 105, the power unit 106, the recording unit 107, and the frame memory 108 are connected to each other via the bus 109.

The optical unit 101 condenses incident light from a subject and guides the incident light to the image sensor 102. The optical unit 101 includes, for example, a plurality of lenses, a diaphragm, a shutter, and the like.

The image sensor 102 executes an imaging process of photoelectrically converting the incident light and generating image data. The image sensor 102 supplies the generated image data (frame) to the DSP circuit 103. In addition, the image sensor 102 controls the size of the diaphragm of the optical unit 101 and controls exposure of the imaging device 100 by supplying an exposure control signal to the optical unit 101.

The DSP circuit 103 executes predetermined digital signal processing on the image data (digital image signal) from the image sensor 102. For example, various kinds of digital signal processing including a demosaic process, a white balance process, a filtering process, and the like are executed. In the processes, the DSP circuit 103 causes the frame memory 108 to retain the image data as necessary. Then, the DSP circuit 103 supplies the processed image data to the display unit 104 or the recording unit 107.

The display unit 104 executes display or the like of an image based on the image data.

The manipulation unit 105 generates a manipulation signal in response to a user manipulation and supplies the manipulation signal to each unit of the imaging device 100.

The power unit 106 supplies power to each unit of the imaging device 100.

The recording unit 107 records the image data or the like.

The frame memory 108 retains the image data in units of frames.

The bus 109 is a common path used for the image sensor 102, the DSP circuit 103, the display unit 104, the manipulation unit 105, the power unit 106, the recording unit 107, and the frame memory 108 to exchange data.

Note that, although the optical unit 101, the image sensor 102, the DSP circuit 103, the display unit 104, the manipulation unit 105, the power unit 106, the recording unit 107, and the frame memory 108 are provided in the same device in the example of FIG. 1, they may be distributed and provided in a plurality of devices. For example, the optical unit 101 or the image sensor 102 may be disposed in the imaging device and the DSP circuit 103 and the like may be disposed in an information processing device.

<Configuration example of image sensor 102>

Next, a configuration example of the image sensor 102 of the imaging device 100 in FIG. 1 will be described with reference to FIGS. 2 to 8.

<Overall Configuration Example of Image Sensor 102>

Figure 2:
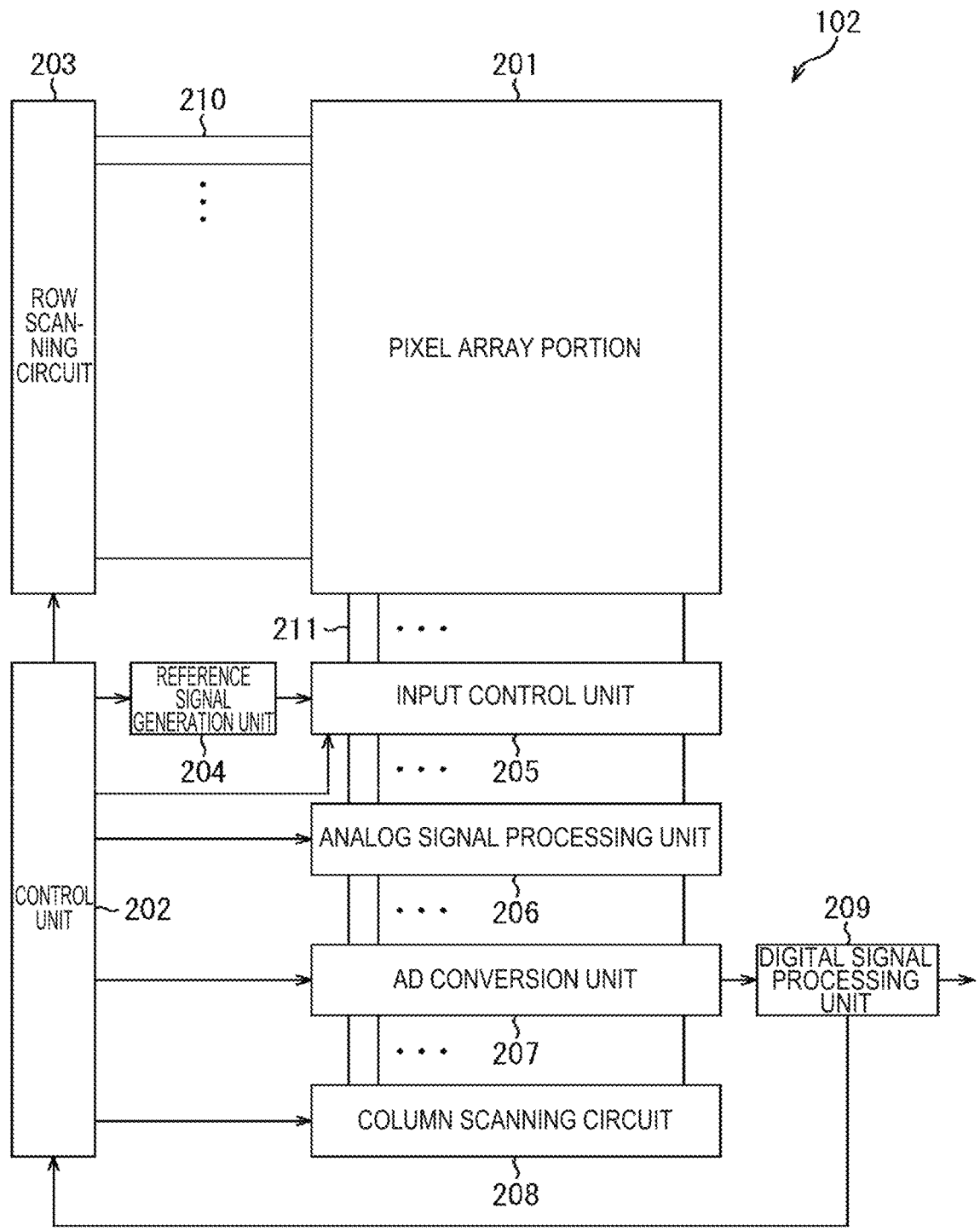
FIG. 2 is a block diagram illustrating a configuration example of an image sensor.

FIG. 2 is a block diagram illustrating an overall configuration example of the image sensor 102.

The image sensor 102 includes a pixel array portion 201, a control unit 202, a row scanning circuit 203, a reference signal generation unit 204, an input control unit 205, an analog signal processing unit 206, an analog digital (AD) conversion unit 207, a column scanning circuit 208, and a digital signal processing unit 209.

In the pixel array portion 201, unit pixels including photoelectric conversion elements photoelectrically converting incident light into charge in accordance with the amount of incident light (hereinafter also simply referred to as pixels) are disposed in an array form. In addition, in the pixel array portion 201, a pixel driving line 210 is wired for each row in the horizontal direction of the drawing (a pixel array direction/horizontal direction of a pixel row) and a vertical signal line 211 is wired for each column in the vertical direction of the drawing (a pixel array direction/vertical direction of the pixel column) in the pixel arrangement of the matrix form.

One end of the pixel driving line 210 is connected to an output end corresponding to each row of the row scanning circuit 203. Note that, although one pixel driving line 210 is illustrated for each row in FIG. 2, two or more pixel driving lines 210 may be provided for each row.

The control unit 202 controls an operation of each unit of the imaging device 100. For example, the control unit 202 controls operation timings of the row scanning circuit 203, the reference signal generation unit 204, the input control unit 205, the analog signal processing unit 206, the AD conversion unit 207, and the column scanning circuit 208.

The row scanning circuit 203 drives each pixel of the pixel array portion 201 under the control of the control unit 202 so that an analog signal with a level in accordance with an amount of incident light is caused to be generated. In addition, the row scanning circuit 203 changes a driving method for each pixel in the pixel array portion 201 in accordance with four driving modes: a normal mode, a sensing mode, an offline calibration mode, and an online calibration mode, under the control of the control unit 202.

The normal mode is a mode in which image data with a high resolution (hereinafter referred to as high-resolution image data) is generated on the basis of a pixel signal of each pixel of the pixel array portion 201. In the normal mode, the analog pixel signal output from each pixel of the pixel array portion 201 is supplied from the pixel array portion 201 to the input control unit 205.

The sensing mode is a mode in which image data with a low resolution (hereinafter referred to as low-resolution image data) is generated on the basis of an added signal which is a pixel signal obtained by adding signals of a plurality of pixels for each pixel block of a predetermined unit of the pixel array portion 201 and an event is detected on the basis of the low-resolution image data. In the sensing mode, an analog additional pixel output from each pixel block of the pixel array portion 201 is supplied from the pixel array portion 201 to the input control unit 205.

The offline calibration mode is a mode in which offline calibration of the image sensor 102 is executed, as will be described below. In the offline calibration mode, each pixel in the pixel array portion 201 is driven in accordance with a similar method to the sensing mode and the analog added signal is supplied from the pixel array portion 201 to the input control unit 205.

The online calibration mode is a mode in which online calibration of the image sensor 102 is executed, as will be described below. In the online calibration mode, each pixel in the pixel array portion 201 is driven in accordance with a similar method to the sensing mode and the analog added signal is supplied from the pixel array portion 201 to the input control unit 205.

The reference signal generation unit 204 generates a reference signal to be used for calibration instead of the added signal and supplies the reference signal to the input control unit 205 under the control of the control unit 202.

The input control unit 205 includes, for example, a switch or the like and selects a signal to be input to the analog signal processing unit 206 under the control of the control unit 202. Specifically, the input control unit 205 selects one of the analog signal (the pixel signal or the added signal) from the pixel array portion 201 and the reference signal from the reference signal generation unit 204 and supplies the selected signal to the analog signal processing unit 206.

The analog signal processing unit 206 executes predetermined analog signal processing on the added signal and the reference signal and supplies the added signal and the reference signal to the AD conversion unit 207. For example, the analog signal processing unit 206 executes a logarithmic conversion process and a voltage conversion process on the added signal and the reference signal.

Note that the analog signal processing unit 206 supplies the pixel signal to the AD conversion unit 207 without particularly processing the pixel signal.

The AD conversion unit 207 executes AD conversion on the analog signal from the analog signal processing unit 206. Specifically, the AD conversion unit 207 executes the AD conversion on the analog pixel signal, added signal, and reference signal to generate digital pixel data, added data, and reference data. The AD conversion unit 207 supplies the generated pixel data, added data, and reference data to the digital signal processing unit 209.

Note that since the added signal is a signal obtained by adding the pixel signals of the plurality of pixels, the added data is pixel data obtained by adding the pixel data of the plurality of pixels.

The column scanning circuit 208 includes a shift register, an address decoder, or the like and selectively scans a circuit portion corresponding to a pixel column of the pixel array portion 201. Thus, signal processing is executed on the analog signals (the pixel signal, the added signal, and the reference signal) for each selected column and the processed signals are supplied to the digital signal processing unit 209.

The digital signal processing unit 209 executes predetermined digital signal processing on the pixel data, the added data, and the reference data.

For example, the digital signal processing unit 209 generates high-resolution image data on the basis of the pixel data of each pixel of the pixel array portion 201 and supplies the generated high-resolution image data to the DSP circuit 103.

For example, the digital signal processing unit 209 generates low-resolution image data on the basis of the added data of each pixel block of the pixel array portion 201 and executes an event detection process on the basis of the low-resolution image data. Note that any event which is a detection target is set. For example, motion detection, face detection, human form detection, or the like within an imaging range of the imaging device 100 is executed as event detection. The digital signal processing unit 209 sets a driving mode on the basis of a detection result or the like of the event and supplies a driving mode signal indicating the set driving mode to the control unit 202.

For example, the digital signal processing unit 209 generates an exposure control signal for controlling exposure of the imaging device 100 on the basis of the added data and supplies the exposure control signal to the optical unit 101 and the control unit 202.

For example, the digital signal processing unit 209 executes calibration of a correction function for correction of the added data on the basis of the added data and the reference data.

<Substrate Configuration Example of Image Sensor 102>

Figure 3:
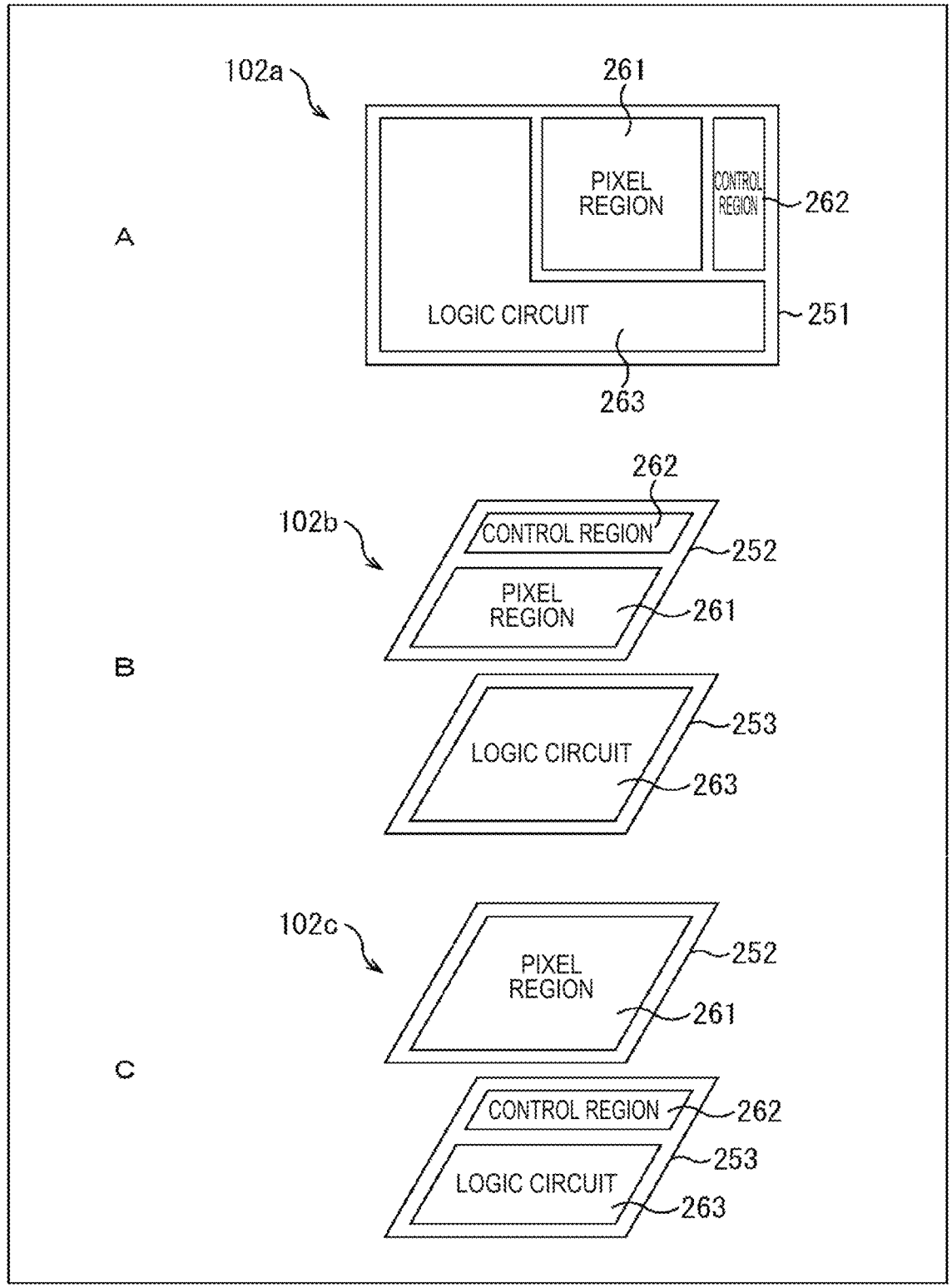
FIG. 3 is a diagram illustrating an example of a substrate configuration of the image sensor.

FIG. 3 is a diagram illustrating an example of a substrate configuration of the image sensor 102.

FIG. 3A illustrates a first substrate configuration of the image sensor 102. In an image sensor 102a in FIG. 3A, a pixel region 261, a control region 262, and a logic circuit 263 that includes a signal processing circuit executing signal processing are provided in one semiconductor substrate 251. In the pixel region 261, for example, the pixel array portion 201 in FIG. 2 is provided. In the control region 262, for example, the control unit 202, the row scanning circuit 203, the reference signal generation unit 204, the input control unit 205, the analog signal processing unit 206, the AD conversion unit 207, and the column scanning circuit 208 in FIG. 2 are provided. In the logic circuit 263, for example, the digital signal processing unit 209 in FIG. 2 is provided.

FIGS. 3B and 3C illustrate second and third substrate configurations of the image sensor 102. In an image sensor 102b in FIG. 3B and an image sensor 102c in FIG. 3C, the pixel region 261 and the logic circuit 263 are formed on different semiconductor substrates to realize a stacked structure.

In the image sensor 102b, the pixel region 261 and the control region 262 are provided in a first semiconductor substrate 252, and the logic circuit 263 is provided in a second semiconductor substrate 253. The first semiconductor substrate 252 and the second semiconductor substrate 253 are electrically connected to each other.

In the image sensor 102c, the pixel region 261 is provided in the first semiconductor substrate 252, and the control region 262 and the logic circuit 263 are provided in the second semiconductor substrate 253. The first semiconductor substrate 252 and the second semiconductor substrate 253 are electrically connected to each other.

JP 2010-245506A, JP 2011-96851A, and the like by the present applicants disclose methods of manufacturing a solid-state imaging device in which the first semiconductor substrate 252 in which the pixel region 261 is formed and the second semiconductor substrate 253 in which the logic circuit 263 is formed are separately formed using a semiconductor process technology and are pasted to be electrically connected to each other, as in the image sensor 102b and the image sensor 102c. By forming the semiconductor substrates separately and pasting them together, contribution to high image quality, mass productivity, and low cost can be achieved. In addition, for example, the first semiconductor substrate 252 and the second semiconductor substrate 253 can be manufactured at different locations.

<Detailed Configuration Example of Each Unit of Image Sensor 102>

Next, detailed configuration examples of the pixel array portion 201, the analog signal processing unit 206, the AD conversion unit 207, and the digital signal processing unit 209 of the image sensor 102 will be described with reference to FIGS. 4 to 8.

Figure 4:
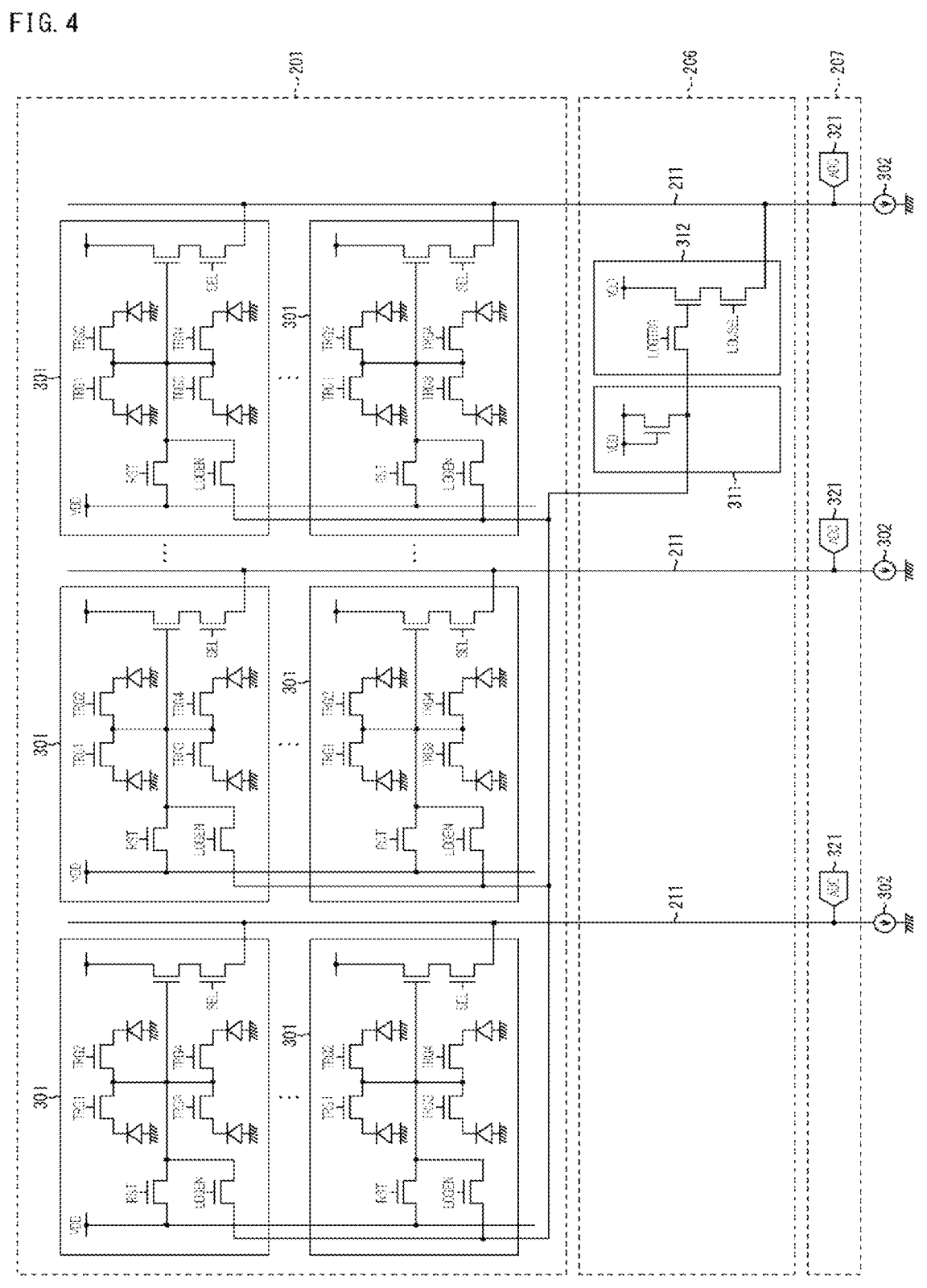

FIG. 4 is a diagram illustrating a detailed configuration example of the pixel array portion 201, the analog signal processing unit 206, and the AD conversion unit 207. Note that in FIG. 4, the control unit 202, the row scanning circuit 203, the reference signal generation unit 204, the input control unit 205, the column scanning circuit 208, and the digital signal processing unit 209 are not illustrated.

In the pixel array portion 201, pixels 301 are disposed in an array form. In the array of the pixels 301 with the matrix form, the vertical signal line 211 is formed in the vertical direction for each column.

Figure 5:
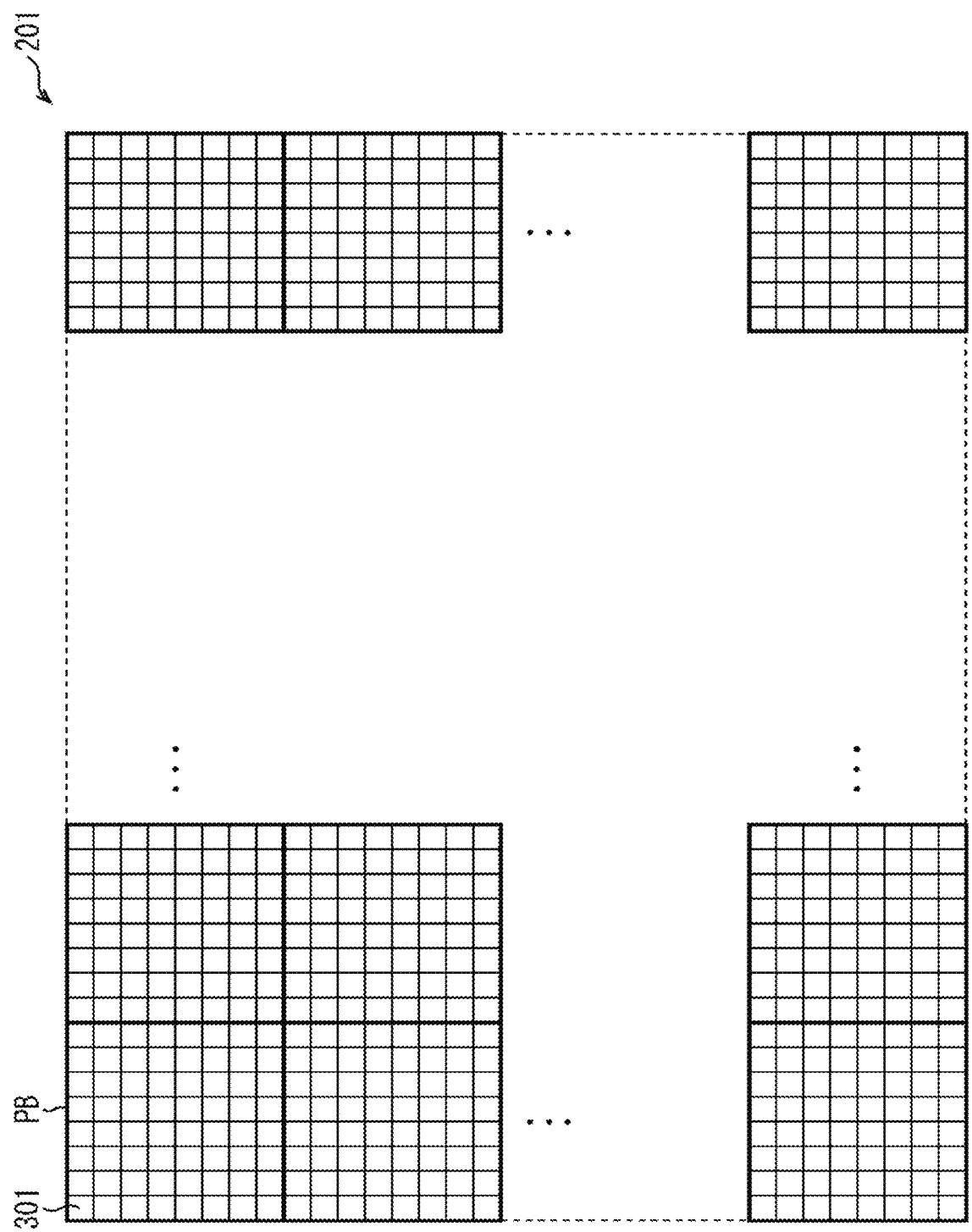
FIG. 5 is a diagram illustrating a configuration example of a pixel block.

In addition, in the pixel array portion 201, as illustrated in FIG. 5, the pixels 301 are divided into a plurality of pixel blocks PB. Then, as will be described below, an added signal is generated by adding the pixel signals of the pixels 301 in the pixel blocks PB.

Note that, although one pixel block PB is formed by the pixels 301 in 8 vertical rows×8 horizontal columns in this example, the pixel block PB can be set to have any size.

In addition, hereinafter, in a case in which it is necessary to individually distinguish the pixel blocks PB, numbers are suffixed to reference signs PB as in a pixel block PB1 and a pixel block PB2.

Figure 6:
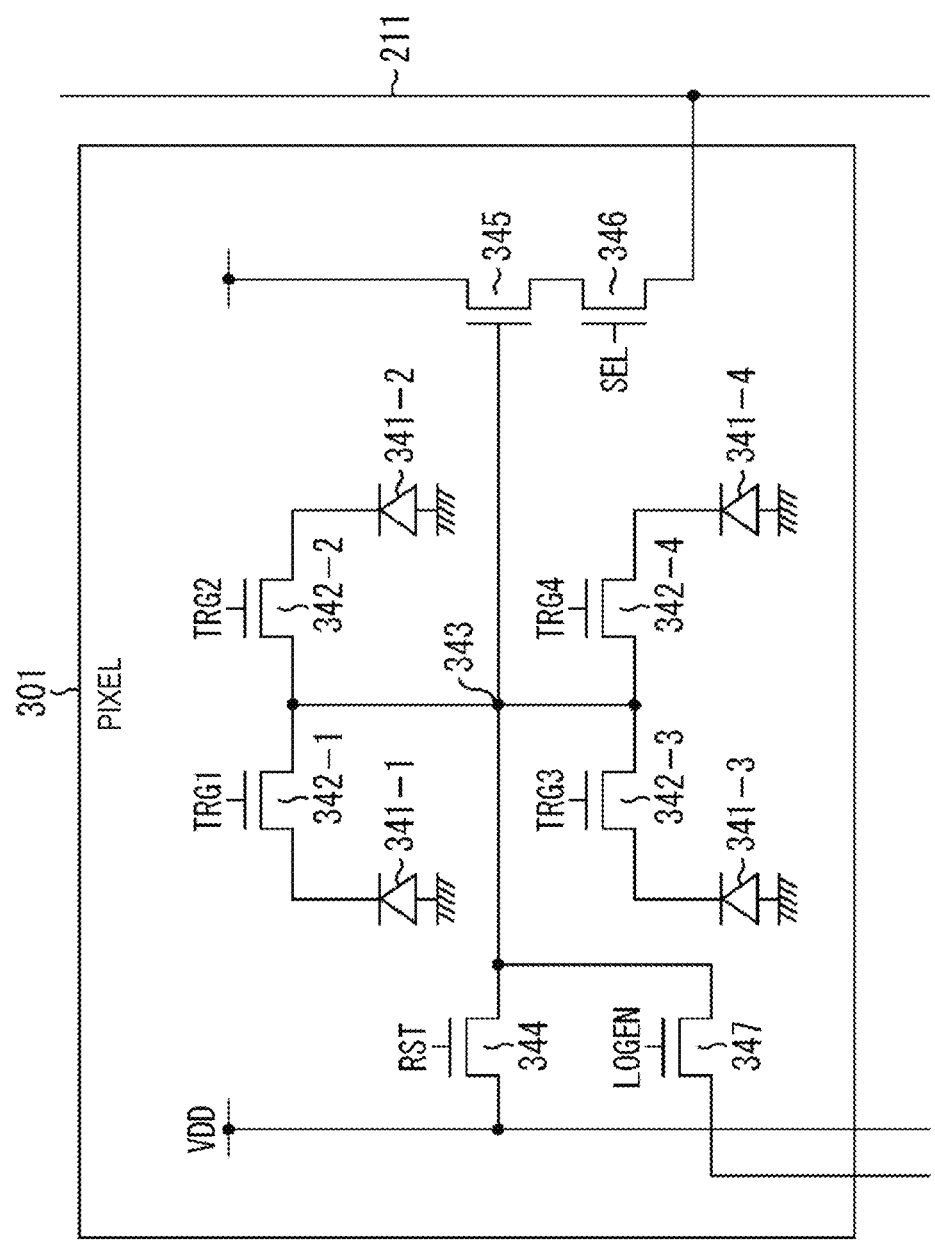
FIG. 6 is a diagram illustrating a configuration example of a pixel.

FIG. 6 is a diagram illustrating an expanded configuration example of the pixel 301.

The pixel 301 has a coexistent pixel structure of 2 horizontal rows×2 vertical columns. Specifically, the pixel 301 includes photoelectric conversion elements 341-1 to 341-4 and transfer gate portions 342-1 to 342-4.

Note that, hereinafter, in a case in which it is not necessary to individually distinguish the photoelectric conversion elements 341-1 to 341-4, the photoelectric conversion elements 341-1 to 341-4 are simply referred to as the photoelectric conversion elements 341. Hereinafter, in a case in which it is not necessary to individually distinguish the transfer gate portions 342-1 to 342-4, the transfer gate portions 342-1 to 342-4 are simply referred to as the transfer gate portions 342.

Then, the four photoelectric conversion elements 341 and the four transfer gate portions 342 share one charge voltage conversion portion 343, a reset transistor 344, an amplification transistor 345, a select transistor 346, and a coupling transistor 347.

Note that, hereinafter, the reset transistor 344, the amplification transistor 345, the select transistor 346, and the coupling transistor 347 are collectively referred to as pixel transistors.

Each photoelectric conversion element 341 includes, for example, a PN junction photodiode, receives light from a subject, and generates and stores charge in accordance with the amount of received light (amount of incident light) by photoelectric conversion.

The transfer gate unit 342-1 includes, for example, an N-channel MOS transistor and is provided between the photoelectric conversion element 341-1 and the charge voltage conversion portion 343. A driving signal TRG1 is supplied to a gate of the transfer gate portion 342-1. The driving signal TRG1 is a pulse signal in which a high level state is an active state (ON state) and a low level state is an inactive state (OFF state). Then, when the driving signal TRG1 enters the active state and the transfer gate portion 342-1 is turned on (enters a conductive state), the charge stored in the photoelectric conversion element 341-1 is transferred to the charge voltage conversion portion 343 via the transfer gate portion 342-1.

Similarly, the transfer gate units 342-2 to 342-4 include N-channel MOS transistors and are provided between the photoelectric conversion elements 341-2 to 341-4 and the charge voltage conversion portion 343, respectively. Similarly to the transfer gate portion 342-1, the transfer gate portions 342-2 to 342-4 transfer charge stored in the photoelectric conversion elements 341-2 to 341-4 to the charge voltage conversion portion 343 in accordance with driving signals TRG2 to TRG4 supplied to the respective gates.

The charge voltage conversion portion 343 is a floating diffusion region (FD) that converts the charge transferred from each photoelectric conversion element 341 via each transfer gate portion 342 into an electric signal (for example, a voltage signal) and outputs the electric signal. The charge voltage conversion portion 343 is connected to the reset transistor 344 and the coupling transistor 347 and is connected to the vertical signal line 211 via the amplification transistor 345 and the select transistor 346.

The reset transistor 344 is an element that appropriately initializes (resets) the charge voltage conversion portion 343 or the like and includes, for example, an N-channel MOS transistor. A drain of the reset transistor 344 is connected to a power supply VDD of a voltage VDD via a power line and a source of the reset transistor 344 is connected to the charge voltage conversion portion 343. A driving signal RST is applied as a reset signal to a gate of the reset transistor 344. The driving signal RST is a pulse signal in which a high level state is an active state (ON state) and a low level state is an inactive state (OFF state). Then, when the driving signal RST enters the active state, the reset transistor 344 is turned on and a potential of the charge voltage conversion portion 343 or the like is reset to the voltage VDD. That is, the charge voltage conversion portion 343 or the like is initialized.

The amplification transistor 345 includes, for example, an N-channel MOS transistor. A gate of the amplification transistor 345 is connected to the charge voltage conversion portion 343 and a drain of the amplification transistor 345 is connected to the power supply VDD and serves as an input unit of a source follower circuit that reads charge obtained through the photoelectric conversion in the photoelectric conversion element 341. That is, a source of the amplification transistor 345 is connected to the vertical signal line 211 via the select transistor 346, and thus the amplification transistor 345 forms the source follower circuit along with a constant current source 302 (see FIG. 4) connected to one end of the vertical signal line 211.

The select transistor 346 includes, for example, an N-channel MOS transistor and is connected between the source of the amplification transistor 345 and the vertical signal line 211. A driving signal SEL is supplied as a select signal to a gate of the select transistor 346. The driving signal SEL is a pulse signal in which a high level state is an active state (ON state) and a low level state is an inactive state (OFF state). Then, when the driving signal SEL enters the active state, the select transistor 346 is turned on and the pixel 301 in which the select transistor 346 is provided enters a select state. When the pixel 301 enters the select state, a signal (pixel signal) output from the amplification transistor 345 is supplied to the input control unit 205 via the vertical signal line 211.

The coupling transistor 347 is a switch for connecting the pixel 301 in the same pixel block PB and includes, for example, an N-channel MOS transistor. A drain of the coupling transistor 347 is connected to the charge voltage conversion portion 343 and a source of the coupling transistor 347 is connected to a source (see FIGS. 4 and 7) of the logarithmic conversion transistor 361 of the logarithmic conversion circuit 311 via the input control unit 205. A driving signal LOGEN is applied to a gate of the coupling transistor 347. The driving signal LOGEN is a pulse signal in which a high level state is an active state (ON state) and a low level state is an inactive state (OFF state).

Then, when the driving signal LOGEN of each pixel 301 in the pixel block PB enters the active state, the coupling transistor 347 is turned on, and thus the pixels 301 in the pixel block PB are connected. At this time, when the driving signals TRG1 to TRG4 of each pixel 301 enter the active state, the charge stored in each photoelectric conversion element 341 of each pixel 301 in the pixel block PB is added, and thus an added signal obtained by adding the pixel signals of the pixels 301 in the pixel block PB is generated. The generated added signal is supplied to the input control unit 205.

For example, in the sensing mode, the transfer gate portion 342 and the coupling transistor 347 of each pixel 301 enter the normally ON state and an added signal is normally output from each pixel block PB.

In each pixel 301, as the pixel driving lines 210 in FIG. 1, a plurality of driving lines are wired, for example, for each row. Then, the driving signals TRG1 to TRG4, the driving signal RST, the driving signal SEL, and the driving signal LOGEN are supplied from the row scanning circuit 203 to each pixel 301 via the plurality of driving signals serving as the pixel driving lines 210.

Referring back to FIG. 4, in the analog signal processing unit 206, for example, the logarithmic conversion circuit 311 and the voltage conversion circuit 312 are individually provided for each pixel block PB.

Figure 7:
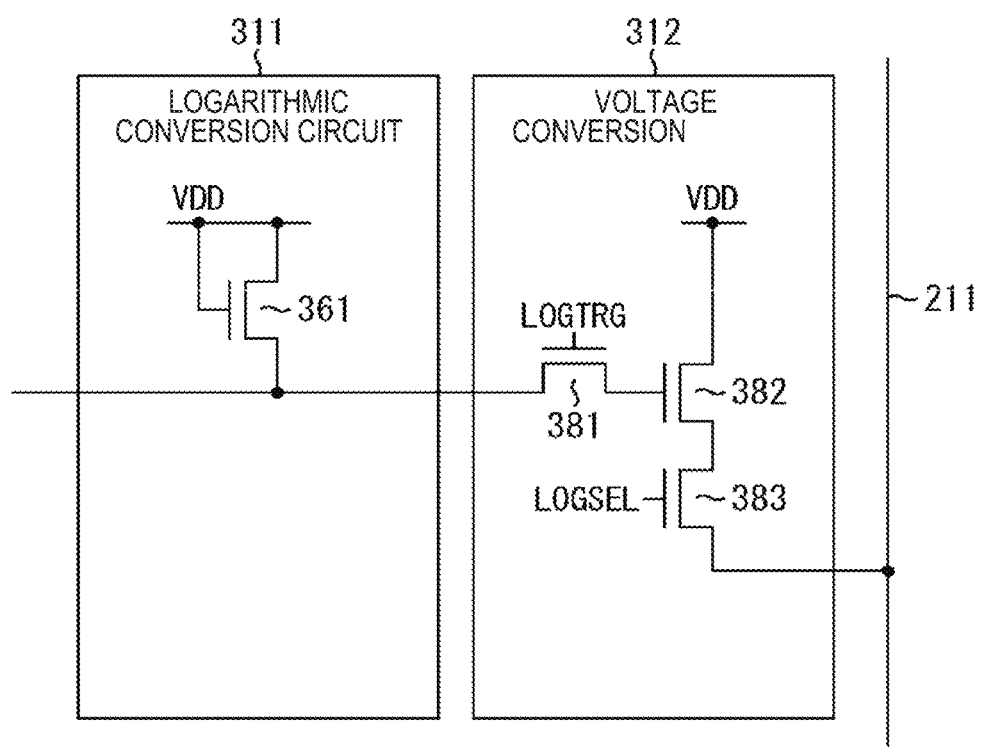
FIG. 7 is a diagram illustrating a configuration example of a logarithmic conversion circuit and a voltage conversion circuit.

FIG. 7 is a diagram illustrating a configuration example of the logarithmic conversion circuit 311 and the voltage conversion circuit 312.

The logarithmic conversion circuit 311 includes the logarithmic conversion transistor 361. The logarithmic conversion transistor 361 includes, for example, an N-channel MOS transistor. A drain and a gate of the logarithmic conversion transistor 361 are connected to the power supply VDD, and a source of the logarithmic conversion transistor 361 is connected to the reference signal generation unit 204 and the source of the coupling transistor 347 of each pixel 301 in the corresponding pixel block PB via the input control unit 205.

The logarithmic conversion circuit 311 executes a logarithmic conversion process on the added signal supplied from the input control unit 205 and supplies the processed added signal to the voltage conversion circuit 312. Thus, the added signal of each pixel block PB is a signal that is logarithmically changed in accordance with an amount of light incident on the pixel block PB. In addition, the logarithmic conversion circuit 311 executes the logarithmic conversion process on a reference signal supplied from the input control unit 205 and supplies the processed reference signal to the voltage conversion circuit 312.

The voltage conversion circuit 312 includes a transfer gate portion 381, an amplification transistor 382, and a select transistor 383.

The transfer gate portion 381 includes, for example, an N-channel MOS transistor. A drain of the transfer gate portion 381 is connected to the source of the logarithmic conversion transistor 361 and a drain of the transfer gate portion 381 is connected to the gate of the amplification transistor 382. A driving signal LOGTRG is supplied to a gate of the transfer gate portion 381. The driving signal LOGTRG is a pulse signal in which a high level state is an active state (ON state) and a low level state is an inactive state (OFF state). Then, when the driving signal LOGTRG enters the active state and the transfer gate portion 381 is turned on (enters a conductive state), the reference signal or the added signal supplied from the logarithmic conversion circuit 311 is input to a gate of the amplification transistor 382.

The amplification transistor 382 includes, for example, an N-channel MOS transistor. A drain of the amplification transistor 345 is connected to the power supply VDD and serves as an input unit of a source follower circuit that reads the added signal or the reference signal (charge of the added signal or the reference signal). That is, a source of the amplification transistor 382 is connected to any one of the vertical signal lines 211 in the pixel block PB via the select transistor 383, and thus the amplification transistor 382 forms the source follower circuit along with a constant current source 302 (see FIG. 4) connected to one end of the vertical signal line 211.

The select transistor 383 includes, for example, an N-channel MOS transistor and is connected between the source of the amplification transistor 382 and the vertical signal line 211. A driving signal LOGSEL is supplied as a select signal to a gate of the select transistor 383. The driving signal LOGSEL is a pulse signal in which a high level state is an active state (ON state) and a low level state is an inactive state (OFF state). Then, when the driving signal LOGSEL enters the active state, the select transistor 383 is turned on and the pixel block PB in which the select transistor 383 is provided enters a select state. When the pixel block PB enters the select state, a signal (added signal or reference signal) output from the amplification transistor 382 is supplied to the input control unit 205 via the vertical signal line 211.

Note that, for example, the driving signals LOGTRG and LOGSEL are supplied from the control unit 202 to each voltage conversion circuit 312.

Referring back to FIG. 4, in the AD conversion unit 207, an analog digital converter (ADC) 321 is provided in each vertical signal line 211. Each ADC 321 executes AD conversion on the pixel signal, the added signal, and the reference signal supplied via the vertical signal line 211, generates pixel data, added data, and reference data, and supplies the pixel data, the added data, and the reference data to the digital signal processing unit 209.

<Configuration Example of Digital Signal Processing Unit 209>

Figure 8:
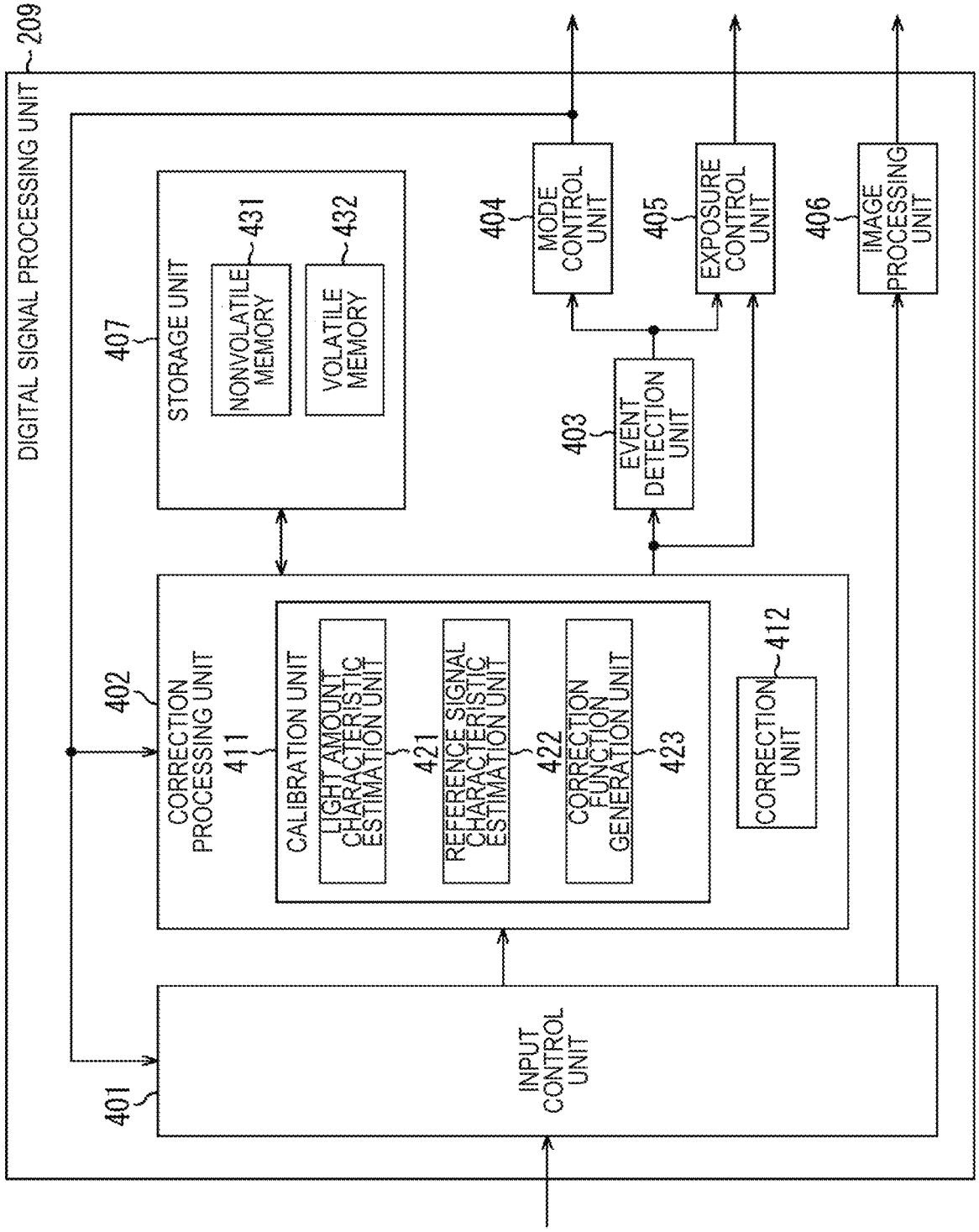
FIG. 8 is a diagram illustrating a configuration example of a digital signal processing unit.

FIG. 8 is a block diagram illustrating a configuration example of the digital signal processing unit 209.

The digital signal processing unit 209 includes an input control unit 401, a correction processing unit 402, an event detection unit 403, a mode control unit 404, an exposure control unit 405, an image processing unit 406, and a storage unit 407.

The input control unit 401 includes, for example, a switch or the like and controls input destinations of the pixel data, the added data, and the reference data supplied from the AD conversion unit 207. For example, the input control unit 401 supplies the pixel data to the image processing unit 406 and supplies the added data and the reference data to the correction processing unit 402.

The correction processing unit 402 executes a process of correcting the added data on the basis of the reference data. The correction processing unit 402 includes a calibration unit 411 and a correction unit 412.

The calibration unit 411 calibrates a correction function for correction of the added data. The calibration unit 411 includes a light amount characteristic estimation unit 421, a reference signal characteristic estimation unit 422, and a correction function generation unit 423.

On the basis of a measurement result of the added data with regard to a predetermined amount of incident light, the light amount characteristic estimation unit 421 estimates a light amount characteristic indicating a relation between the added data and the amount of incident light of each pixel block PB.

The reference signal characteristic estimation unit 422 estimates a reference signal characteristic indicating a correspondent relation between the reference signal and the amount of incident light of each pixel block PB on the basis of the measurement result of the reference data and the light amount characteristic of each pixel block PB. The reference signal characteristic estimation unit 422 generates a reference signal characteristic table indicating a reference signal characteristic of each pixel block PB and causes a nonvolatile memory 431 of the storage unit 407 to store the reference signal characteristic table.

The correction function generation unit 423 generates a correction function with regard to each pixel block PB on the basis of the measurement result of the reference data and the reference signal characteristic of each pixel block PB. The correction function corrects the added data logarithmically changed with respect to the amount of incident light so that the added data is linearly changed with respect to the amount of incident light. That is, the correction function corrects a relation between the added data and the amount of incident light to a linear relation. In addition, the correction function corrects a variation in the light amount characteristic between the pixel blocks PB.

The correction unit 412 corrects the added data on the basis of the correction function. The correction unit 412 supplies the corrected added data (hereinafter referred to as corrected data) to the event detection unit 403 and the exposure control unit 405.

The event detection unit 403 detects a predetermined event on the basis of low-resolution image data generated from the corrected data. The event detection unit 403 supplies data indicating a detection result of the event to the mode control unit 404 and the exposure control unit 405.

The mode control unit 404 controls (switches) a driving mode on the basis of the detection result or the like of the event. The mode control unit 404 supplies a mode signal indicating the set driving mode to the input control unit 401, the correction processing unit 402, and the control unit 202 (see FIG. 2).

The exposure control unit 405 executes exposure control of the imaging device 100 on the basis of the corrected data. The exposure control unit 405 generates an exposure control signal for executing exposure control of the imaging device 100 and supplies the exposure control signal to the optical unit 101 (see FIG. 1) and the control unit 202 (see FIG. 2).

The image processing unit 406 generates high-resolution image data on the basis of the pixel data and supplies the generated high-resolution image data to the DSP circuit 103.

The storage unit 407 includes a nonvolatile memory 431 and a volatile memory 432. The nonvolatile memory 431 includes, for example, a one-time programmable (OTP) memory or a rewritable nonvolatile memory such as a flash memory and stores data necessary for preservation, such as a reference signal characteristic table. The volatile memory 432 includes a volatile memory such as an SRAM and stores data to be temporarily used in a process of the digital signal processing unit 209.

<Necessity of Calibration>

Next, necessity of calibration of the imaging device 100 will be described with reference to FIGS. 9 to 12.

Figure 9:
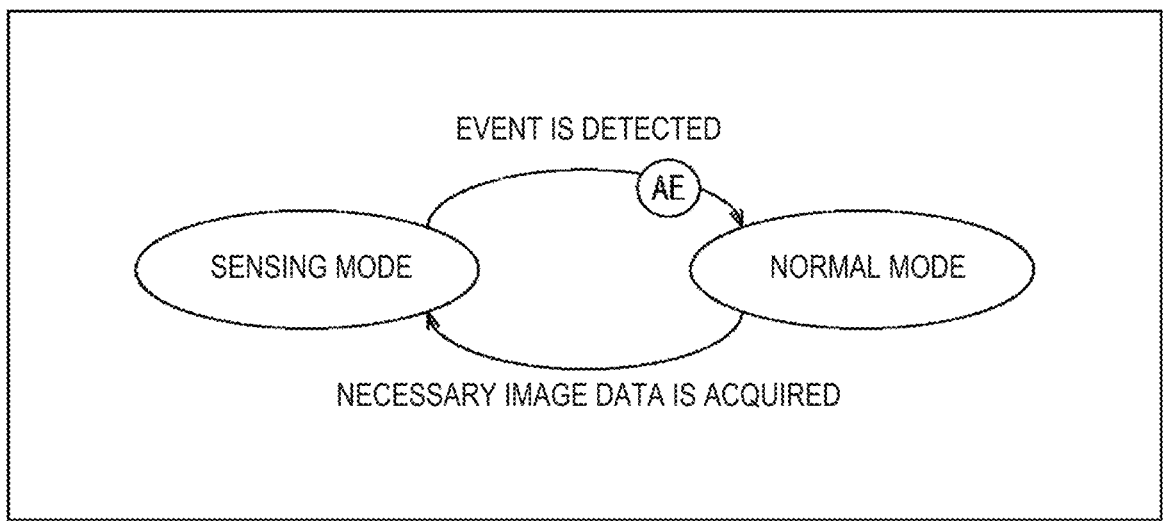
FIG. 9 is a diagram illustrating a transition method for a driving mode.

As illustrated in FIG. 9, the imaging device 100 transitions to the normal mode when an event is detected on the basis of the low-resolution image data in the sensing mode. Then, in the normal mode, the normal mode transitions to the sensing mode after image data (high-resolution image data) necessary for analysis or the like of a generated event is acquired.

Here, before the sensing mode transitions to the normal mode, automatic exposure control (AE) is executed such that the high-resolution image data can be acquired with appropriate exposure from the first frame. The automatic exposure control is executed on the basis of the corrected data.

Figure 10:
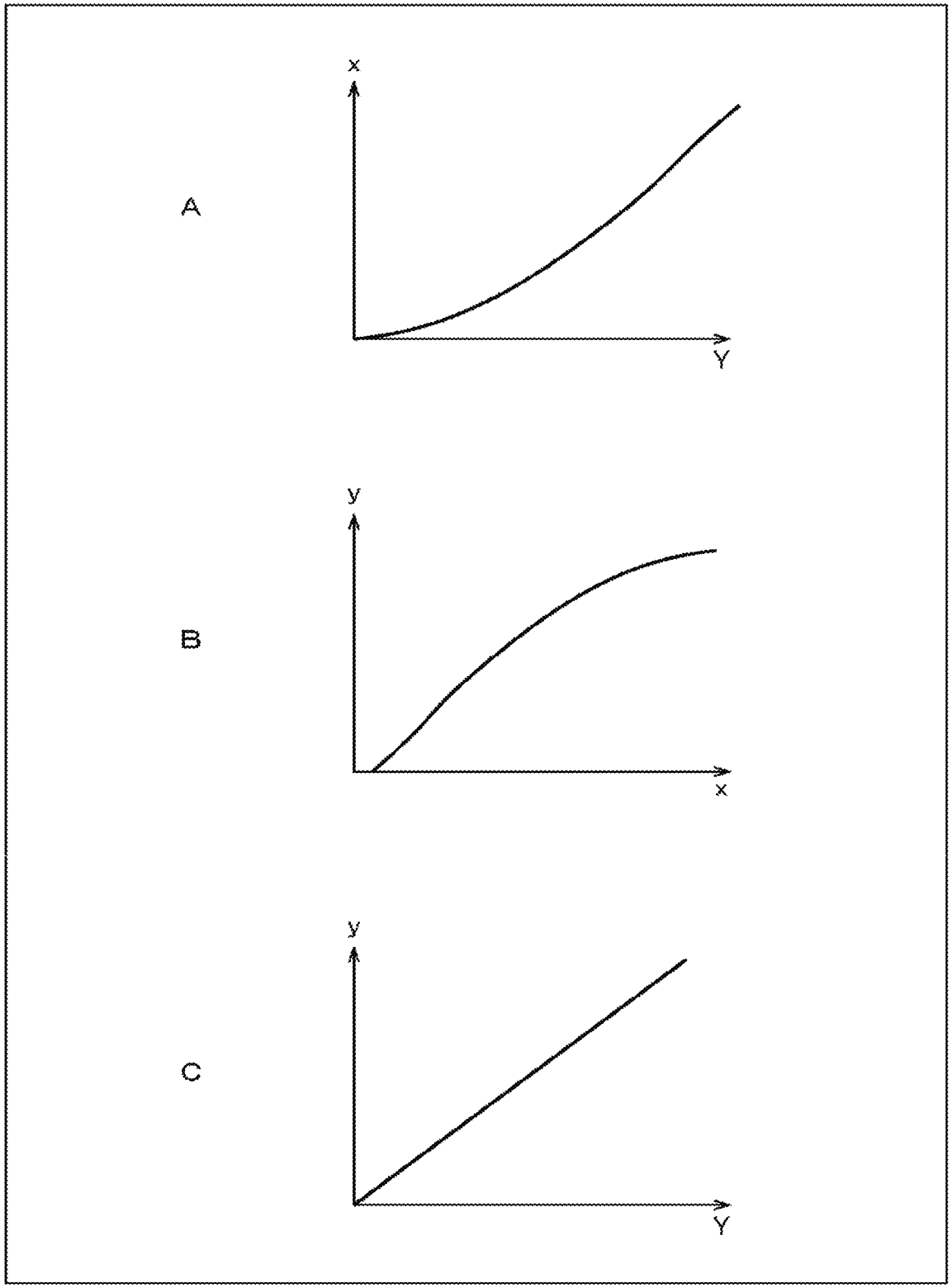
FIG. 10 is a graph illustrating examples of a light amount characteristic, a correction function, and a characteristic of corrected data of a pixel block.

FIG. 10 illustrates a relation among illumination X, the added data x, and corrected data y in the pixel block PB.

FIG. 10A illustrates a graph of a light amount characteristic indicating a relation between the illumination Y in the pixel block PB and the added data x based on the added signal output from the pixel block PB. The horizontal axis represents the illumination y (of which a unit is a lux) and the vertical axis represents the added data x.

Note that an amount of light incident on the pixel block PB is calculated by multiplying the illumination Y by the area of a light reception surface of the pixel block PB. Accordingly, the relation between the illumination Y of the pixel block PB and the added data x indicates a relation between the amount of incident amount of the pixel block PB and the added data x.

As described above, since the added signal is a signal logarithmically converted by the logarithmic conversion circuit 311, the added data x is logarithmically converted without being linearly changed with respect to the illumination Y. Accordingly, it is necessary to execute correction using the correction function so that the added data x is linearly changed with respect to the illumination Y.

FIG. 10B is a graph illustrating an example of a correction function. The horizontal axis represents the added data x and the vertical axis represents the corrected data y.

FIG. 10C is a graph illustrating a relation between the illumination Y and the corrected data y in a case in which the correction function of FIG. 10B is used. The horizontal axis represents the illumination y (of which a unit is a lux) and the vertical axis represents the corrected data y. As illustrated in the graph, the corrected data y linearly changed with respect to the illumination Y can be obtained by correcting the added data x using the correction function.

Here, the light amount characteristic of each pixel block PB has a variation between the pixel blocks PB.

Figure 11:
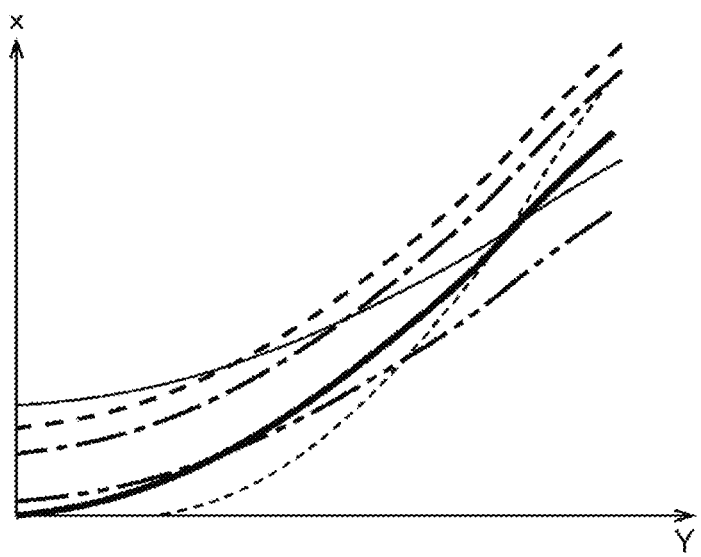
FIG. 11 is a graph illustrating an example of the light amount characteristic of each pixel block.

For example, FIG. 11 illustrates a graph of a light amount characteristic as in FIG. 10A. Specifically, FIG. 11 illustrates a graph of a light amount characteristic of each pixel block PB. The light amount characteristics of the pixel blocks PB are indicated by different kinds of curve lines.

The variation in the light amount characteristic between the pixel blocks PB occurs due to a variation in the characteristic of each pixel 301, a variation in the characteristics of the logarithmic conversion circuit 311, the voltage conversion circuit 312, and the ADC 321 corresponding to each pixel block PB, or the like. A variation in a characteristic of each pixel 301 occurs due to, for example, a variation in sensitivity of the photoelectric conversion element 341.

Accordingly, it is preferable to correct the variation in the light amount characteristic between the pixel blocks PB by correcting the added data to corrected data using a different correction function for each pixel block PB (for each added data).

In addition, the light amount characteristic of each pixel block PB changes in accordance with ambient temperature of the imaging device 100.

Figure 12:
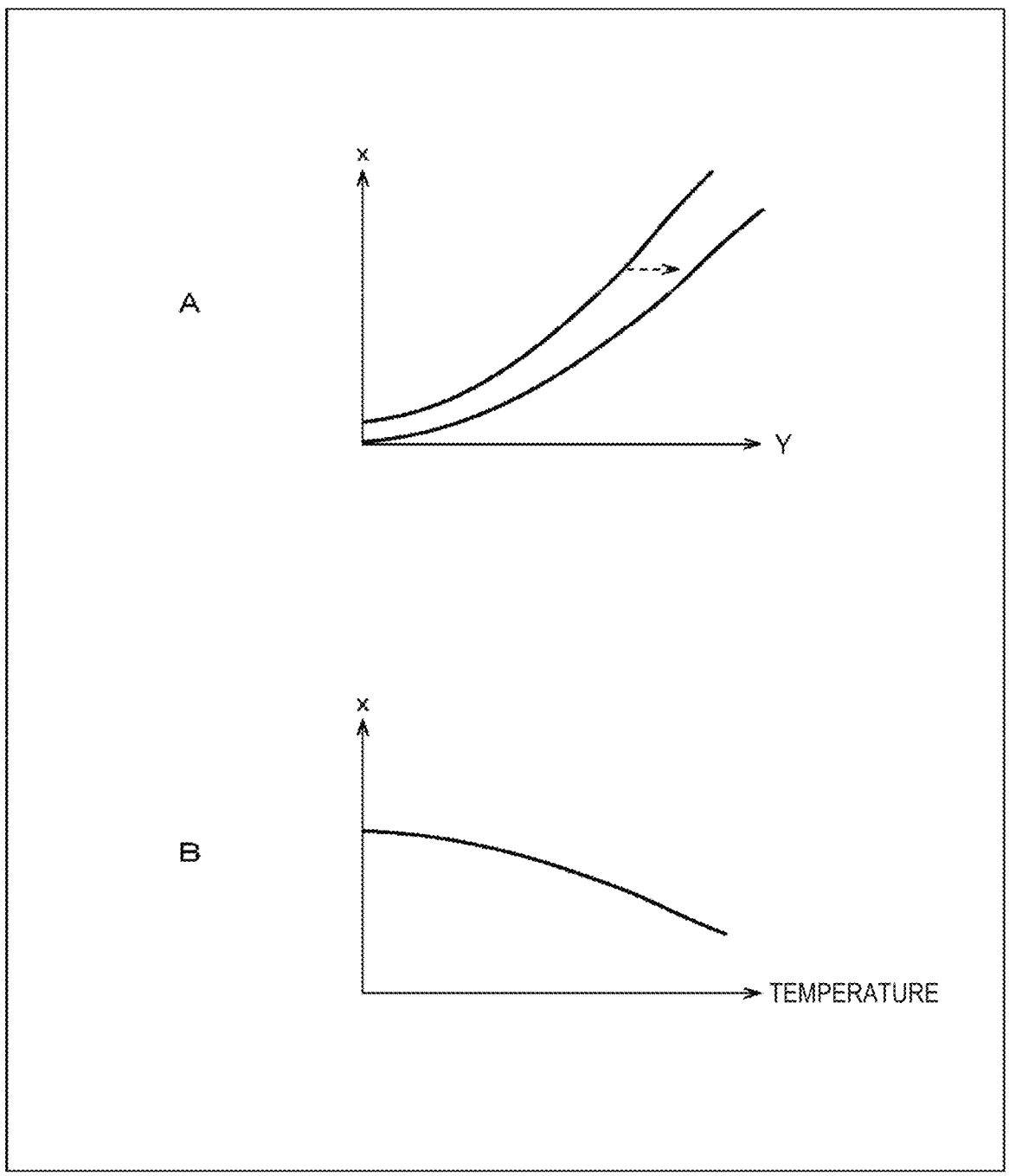
FIG. 12 is a diagram illustrating a temperature characteristic of the light amount characteristic of the pixel block.

FIG. 12 is a diagram illustrating an example of a temperature characteristic of the light amount characteristic of the pixel block PB. FIG. 12A illustrates an example of a change of the graph of the light amount characteristic in accordance with the temperature. The horizontal axis represents the illumination Y (of which a unit is a lux) and the vertical axis represents the added data x. FIG. 12B illustrates an example of a change of the added data in accordance with the temperature in a case in which the illumination is constant in the pixel block PB. The horizontal axis represents a temperature (of which a unit is ° C.) and the vertical axis represents the added data x.

As illustrated in FIG. 12A, the graph of the light amount characteristic is moved in an arrow direction as the ambient temperature increases. In addition, as illustrated in FIG. 12B, even when the illumination (the amount of incident light) is constant in the pixel block PB, the added data x decreases with an increase in the ambient temperature.

Note that the characteristic of each pixel 301 is rarely affected by the temperature and the change in the characteristic in accordance with the temperature is small. On the other hand, the characteristics of the logarithmic conversion circuit 311 and the voltage conversion circuit 312 of the analog signal processing unit 206 and the ADC 321 of the AD conversion unit 207 are easily affected by the temperature and the change in the characteristics in accordance with the temperature is large. In particular, the characteristic of the logarithmic conversion circuit 311 considerably changes in accordance with the temperature.

Accordingly, the temperature change of the light amount characteristic of each pixel block PB considerably results from the circuit after the added signal is output from each pixel block PB.

Figure 13:
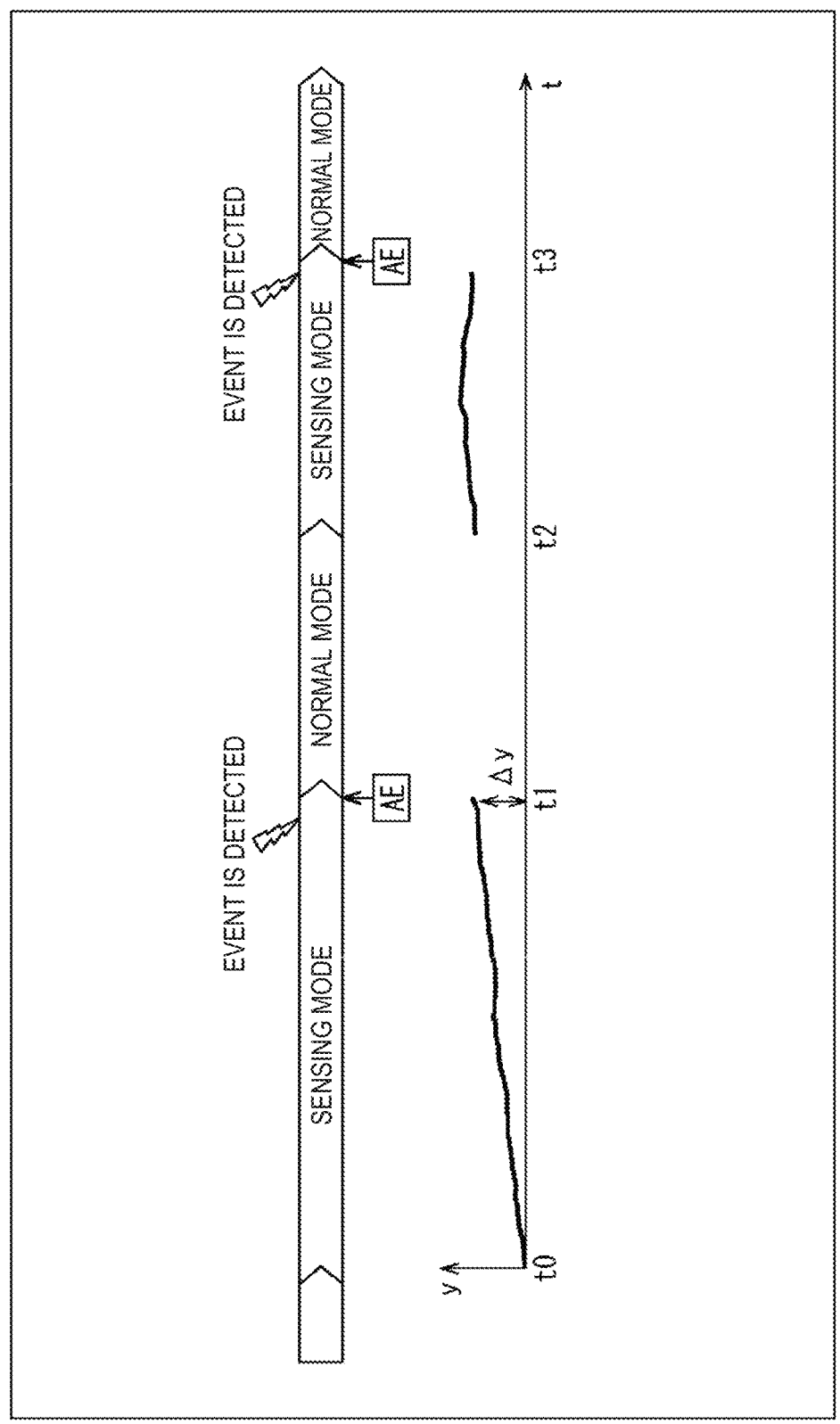
FIG. 13 is a diagram illustrating a change in corrected data during a sensing mode.

The lower drawing of FIG. 13 illustrates a graph indicating an example of a change in the corrected data y with respect to the same amount of incident light of that during the sensing mode. The horizontal axis represents a time and the vertical axis represents the corrected data y.

For example, although the amount of light incident on the pixel block PB is constant, the light amount characteristic is changed when the ambient temperature changes. Therefore, a value of the added data x changes. Accordingly, a value of the corrected data y obtained by correcting the added data x also changes.

For example, a difference Δy occurs between the value of the corrected data y at time t0 at the time of starting of the sensing mode and the corrected data y at time t1 at the time of ending of the sensing mode.

Accordingly, in a case in which the automatic exposure control is executed on the basis of the corrected data y, a difference occurs in a control amount of exposure between time t0 and time t1 even when the amount of incident light (brightness of a subject or a background) is the same. As a result, for example, even when the exposure is appropriately set at time t0, the exposure is not appropriately set at time t1 in some cases. Thus, the exposure of the imaging device 100 is not appropriately set irrespective of the automatic exposure control executed before transition to the normal mode by detecting an event, and thus there is concern of quality of the high-resolution image data at the time of starting of the normal mode deteriorating.

In addition, when a characteristic of the corrected data y changes in accordance with the ambient temperature during the sensing mode, quality of the low-resolution image data deteriorates. As a result, there is concern of detection precision of an event deteriorating.

In contrast, the imaging device 100 appropriately calibrates the correction function (online calibration) during imaging. Thus, the light amount characteristic of each pixel block PB is maintained substantially constantly irrespective of a change in temperature and a variation between the pixel blocks PB is suppressed.

<Process of Imaging Device 100>

Next, a process of the imaging device 100 will be described with reference to FIGS. 14 to 22.

<Offline Calibration Process>

First, an offline calibration process executed by the imaging device 100 will be described with reference to the flowchart of FIG. 14.

This process is executed only once in a test step after manufacturing, for example, in a case in which the nonvolatile memory 431 of the image sensor 102 is of an OTP type. This process is executed at a predetermined timing (for example, periodically once per year) in a case in which the nonvolatile memory 431 is of a rewritable type.

In step S1, the mode control unit 404 is set to the offline calibration mode. The mode control unit 404 supplies a mode signal indicating the set offline calibration mode to the input control unit 401, the correction processing unit 402, and the control unit 202.

Thus, a process of outputting the added data starts. Specifically, the following process starts.

The pixel array portion 201 generates the added signal of each pixel block PB and supplies the added signal to the input control unit 205.

The input control unit 205 supplies the added signal of each pixel block PB to the analog signal processing unit 206.

The analog signal processing unit 206 executes the logarithmic conversion and the voltage conversion on the added signal of each pixel block PB and supplies the converted added signal to the AD conversion unit 207.

The AD conversion unit 207 converts the analog added signal of each pixel block PB into the digital added data and supplies the added data of each pixel block PB to the input control unit 401 of the digital signal processing unit 209.

The input control unit 401 supplies the added data of each pixel block PB to the correction processing unit 402.

In step S2, the imaging device 100 measures the added data with regard to the amount of incident light with a low level.

For example, the light reception surface of the pixel array portion 201 of the image sensor 102 is set substantially uniformly with illumination YL of a predetermined low level using an external light source. In this state, the imaging device 100 executes an imaging process, for example, N times. Then, the light amount characteristic estimation unit 421 acquires the added data of each block PB equivalent to N frames and retains the added data in the volatile memory 432.

In step S3, the light amount characteristic estimation unit 421 calculates an average value of the added data with regard to the amount of incident light with the low level. Specifically, the light amount characteristic estimation unit 421 calculates an average value of the added data of each pixel block PB equivalent to N frames obtained in the process of step S2. The light amount characteristic estimation unit 421 causes the volatile memory 432 to retain the average value of the added data of each pixel block PB.

In step S4, the imaging device 100 measures the added data with regard to the amount of incident light with a middle level. That is, in a state in which the light reception surface of the pixel array portion 201 of the image sensor 102 is set substantially uniformly with illumination YM (>illumination YL) of a predetermined middle level using an external light source, a process similar to step S2 is executed.

In step S5, through a process similar to step S3, an average value of the added data of each pixel block PB with regard to the amount of incident light with the middle level is calculated and retained in the volatile memory 432.

In step S6, the imaging device 100 measures the added data with regard to the amount of incident light with a high level. That is, in a state in which the light reception surface of the pixel array portion 201 of the image sensor 102 is set substantially uniformly with illumination YH (>illumination YM) of a predetermined high level using an external light source, a process similar to step S2 is executed.

In step S7, through a process similar to step S3, an average value of the added data of each pixel block PB with regard to the amount of incident light with the high level is calculated and retained in the volatile memory 432.

In step S8, the light amount characteristic estimation unit 421 estimates the light amount characteristic of the image sensor 102 on the basis of a measurement result of the added data.

For example, the light amount characteristic estimation unit 421 generates a quadratic interpolation function on the basis of the average value of the added data with regard to the illumination at three stages of the illumination YL, the illumination YM, and the illumination YH for each pixel block PB. The interpolation function is a function that expresses the light amount characteristic indicating the relation between the added data and the illumination (that is, the amount of incident light) of each pixel block PB and is referred to as a light amount characteristic function.

Figure 15:
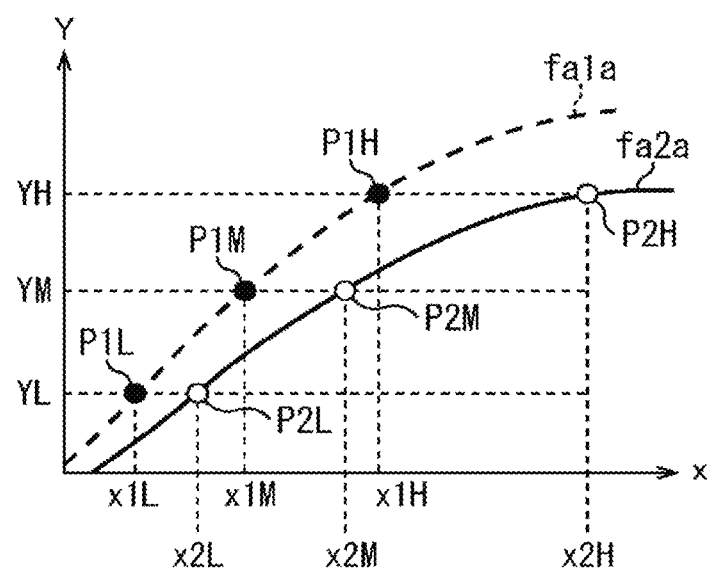
FIG. 15 is a graph illustrating a first example of the light amount characteristic of each pixel block.

FIG. 15 is a graph illustrating an example of the light amount characteristic function. The horizontal axis represents added data and the vertical axis represents illumination (of which a unit is a lux).

Points P1L, P1M, and P1H are points corresponding to the pieces of added data (an average value of the added data) x1L, x1M, and x1H of the pixel block PB1 in the illumination YL, the illumination YM, and the illumination YH. Then, a light amount characteristic function fa1a of the pixel block PB1 is generated through quadratic interpolation based on the points P1L, P1M, and P1H.

Points P2L, P2M, and P2H are points corresponding to the pieces of added data (an average value of the added data) x2L, x2M, and x2H of the pixel block PB2 in the illumination YL, the illumination YM, and the illumination YH. Then, a light amount characteristic function fa2a of the pixel block PB2 is generated through quadratic interpolation based on the points P2L, P2M, and P2H.

In this way, the light amount characteristic function of each pixel block PB is generated. Then, the light amount characteristic estimation unit 421 causes the volatile memory 432 to retain data (for example, a coefficient of the light amount characteristic function) indicating the quadratic light amount characteristic function of each pixel block PB.

At this time, a measurement result of the added data used to generate the light amount characteristic function of each pixel block PB is erased from the volatile memory 432.

In step S9, the input control unit 205 switches the signal to the reference signal. Specifically, the row scanning circuit 203 turns the driving signals TRG1 to TRG4 of each pixel 301 and the driving signal LOGEN off under the control of the control unit 202. Thus, the output of the added signal from each pixel block PB is stopped.

The input control unit 205 switches the signal supplied to the analog signal processing unit 206 from the added signal of each pixel block PB supplied from the pixel array portion 201 to the reference signal supplied from the reference signal generation unit 204 under the control of the control unit 202.

In step S10, the imaging device 100 measures the reference data with regard to the reference signal with the low level.

Specifically, the reference signal generation unit 204 generates a reference signal with a current value iL of a predetermined low level and supplies the reference signal to the input control unit 205 under the control of the control unit 202.

The input control unit 205 supplies the reference signal to the logarithmic conversion circuit 311 corresponding to each pixel block PB in the analog signal processing unit 206 under the control of the control unit 202.

The logarithmic conversion circuit 311 and the voltage conversion circuit 312 corresponding to each pixel block PB execute the logarithmic conversion and the voltage conversion and supply the processed reference signal to the AD conversion unit 207.

Note that, hereinafter, the reference signal processed through the logarithmic conversion and the voltage conversion by the logarithmic conversion circuit 311 and the voltage conversion circuit 312 corresponding to each pixel block PB is referred to as a reference signal corresponding to each pixel block PB or a reference signal of each pixel block PB.

The ADC 321 corresponding to each pixel block PB executes the AD conversion on the analog reference signal, generates digital reference data, and supplies the converted reference data to the correction processing unit 402 via the input control unit 205 of the digital signal processing unit.

Accordingly, the reference data of each pixel block PB becomes data obtained by converting the reference signal into the reference data using the logarithmic conversion circuit 311, the voltage conversion circuit 312, and the ADC 321 corresponding to each pixel block PB.

In this state, for example, the reference signal characteristic estimation unit 422 executes measurement of the reference data of each pixel block PB N times and causes the volatile memory 432 to retain a measurement result.

In step S11, the reference signal characteristic estimation unit 422 calculates the average value of the reference data with regard to the reference signal with the low level. Specifically, the reference signal characteristic estimation unit 422 calculates the average value of the reference data of each pixel block PB measured in the process of step S10.

The reference signal characteristic estimation unit 422 causes the volatile memory 432 to retain the average value of the reference data of each pixel block PB.

In step S12, the imaging device 100 measures each piece of reference data with regard to the reference signal with the middle level. That is, in a state in which the current value of the reference signal is set to a current value iM (>the current value iL) of the predetermined middle level, a process similar to step S10 is executed.

In step S13, through a process similar to step S11, the average value of the reference data of each pixel block PB with regard to the reference signal with the middle level is calculated and retained in the volatile memory 432.

In step S14, the imaging device 100 measures each piece of reference data with regard to the reference signal with the high level. That is, in a state in which the current value of the reference signal is set to a current value iH (>the current value iM) with the predetermined high level, a process similar to step S10 is executed.

In step S15, through a process similar to step S11, the average value of the reference data of each pixel block PB with regard to the reference signal with the high level is calculated and retained in the volatile memory 432.

In step S16, the reference signal characteristic estimation unit 422 estimates the reference signal characteristic of the image sensor 102 on the basis of the light amount characteristic and the measurement result of the reference data.

Specifically, the reference signal characteristic estimation unit 422 estimates illumination of each pixel block PB equivalent to the reference signal with each level by substituting the reference data (the average value of the reference data) with regard to the reference signal with each level of each pixel block PB into the light amount characteristic function of each pixel block PB.

Here, a specific example of the process of step S16 will be described with reference to FIG. 16.

FIG. 16B illustrates graphs of the same light amount characteristic function fa1a and light amount characteristic function fa2a as those of FIG. 15. FIG. 16A illustrates a graph of a reference signal characteristic indicating a correspondent relation between the reference signal and the illumination with regard to the pixel block PB. The horizontal axis represents a current value (of which a unit is A) of the reference signal and the vertical axis represents illumination (of which a unit is a lux) of the pixel block PB.

For example, in a case in which the reference data (the average value of the reference data) of the pixel block PB1 with regard to the reference signal with the low level is x11L, as illustrated in FIG. 16B, illumination YL1 is calculated by substituting reference data x11L into the light amount characteristic function fa1a. Then, as illustrated in FIGS. 16A and 16B, the current value iL and the illumination YL1 of the reference signal with the low level are associated. Thus, the illumination of the pixel block PB1 equivalent to the reference signal with the low level is estimated to be the illumination YL1.

For example, in a case in which the reference data (the average value of the reference data) of the pixel block PB1 with regard to the reference signal with the middle level is x11M, as illustrated in FIG. 16B, illumination YM1 is calculated by substituting reference data x11M into the light amount characteristic function fa1a. Then, as illustrated in FIGS. 16A and 16B, the current value iM and the illumination YM1 of the reference signal with the middle level are associated. Thus, the illumination of the pixel block PB1 equivalent to the reference signal with the middle level is estimated to be the illumination YM1.

For example, in a case in which the reference data (the average value of the reference data) of the pixel block PB1 with regard to the reference signal with the high level is x11H, as illustrated in FIG. 16B, illumination YH1 is calculated by substituting reference data x11H into the light amount characteristic function fa1a. Then, as illustrated in FIGS. 16A and 16B, the current value iH and the illumination YH1 of the reference signal with the high level are associated. Thus, the illumination of the pixel block PB1 equivalent to the reference signal with the high level is estimated to be the illumination YH1.

Similarly, the illumination of the pixel block PB2 equivalent to the reference signals with the low level, the middle level, and the high level is estimated to be the illumination YL2, the illumination YM2, and the illumination YH2.

In addition, similarly, the illumination of each pixel block PB equivalent to the reference signals with the low level, the middle level, and the high level is estimated.

Then, the reference signal characteristic estimation unit 422 generates a reference signal characteristic table indicating the reference signal characteristic of each pixel block PB and causes the nonvolatile memory 431 to store the reference signal characteristic table.

FIG. 17 illustrates an example of the reference signal characteristic table. In this example, the illumination of each pixel block PB equivalent to the current value iL, the current value iM, and the current value iH of the reference signals with the low level, the middle level, and the high level is registered.

At this time, the data indicating the light amount characteristic function of each pixel block PB and the measurement result of the reference data used to generate the reference signal characteristic table are erased from the volatile memory 432.

Note that FIG. 16A illustrates the graphs of the reference signal characteristic function fb1a indicating the reference signal characteristic of the pixel block PB1 and the reference signal characteristic function fb2a indicating the reference signal characteristic of the pixel block PB2.

For example, points P21L, P21M, and P21H in FIG. 16A are points corresponding to reference data x21L, reference data x21M, and reference data x21H of the pixel block PB1 with regard to the reference signals of the current values iL, iM, and iH. Then, the reference signal characteristic function fb1a is generated through quadratic interpolation based on the points P21L, P21M, and P21H.

Points P22L, P22M, and P22H in FIG. 16A are points corresponding to reference data x22L, reference data x22M, and reference data x22H of the pixel block PB2 with regard to the reference signals of the current values iL, iM, and iH. Then, the reference signal characteristic function fb2a is generated through quadratic interpolation based on the points P22L, P22M, and P22H.

Incidentally, as described above, the characteristic of each pixel 301 of the pixel array portion 201 is rarely affected by the ambient temperature. Accordingly, the characteristic of the added signal of each pixel block PB output from the pixel array portion 201 is substantially constant irrespective of the ambient temperature. That is, the relation between the illumination (the amount of incident light) of each pixel block PB and the added signal output from each pixel block PB is not substantially changed in accordance with the ambient temperature.

On the other hand, the reference signal is used in online calibration to be described below instead of the added signal. Then, as described above, the relation between the illumination of each pixel block PB and the added signal output from each pixel block PB is not substantially changed in accordance with the ambient temperature. Accordingly, the relation between the reference signal and the illumination of each pixel block PB is also considered to be substantially constant irrespective of the ambient temperature. That is, the reference signal characteristic of each pixel block PB can be considered to be substantially constant irrespective of the ambient temperature.

In this way, the offline calibration process is executed. Through the offline calibration, a variation in the characteristic of each pixel 301 (each pixel block PB) in which an influence of temperature is small is mainly calibrated.

<Imaging Process>

Figure 18:
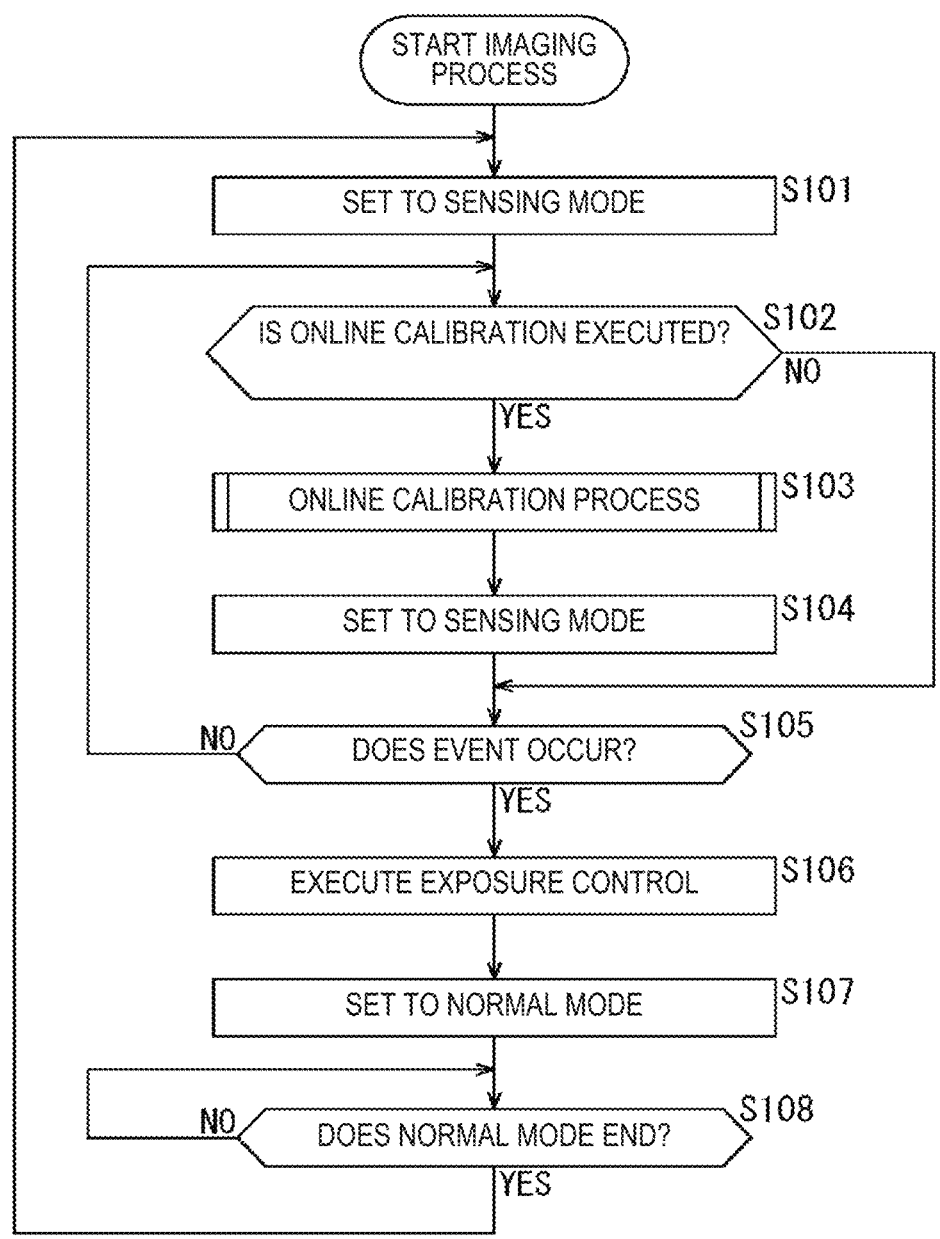
FIG. 18 is a flowchart for describing an imaging process.

Next, an imaging process executed by the imaging device 100 will be described with reference to the flowchart of FIG. 18.

For example, this process starts when the imaging device 100 is powered on, and ends when the imaging device 100 is powered off.

In step S101, the imaging device 100 is set to the sensing mode. The mode control unit 404 supplies the mode signal indicating the set sensing mode to the input control unit 401, the correction processing unit 402, and the control unit 202.

Thus, a process of photographing a low-resolution image is started.

Specifically, the following process is started.

The pixel array portion 201 generates the added signal of each pixel block PB and supplies the added signal to the input control unit 205.

The input control unit 205 supplies the added signal of each pixel block PB to the analog signal processing unit 206.

The analog signal processing unit 206 executes the logarithmic conversion and the voltage conversion on the added signal of each pixel block PB and supplies the converted added signal to the AD conversion unit 207.

The AD conversion unit 207 converts the analog added signal of each pixel block PB into the digital added data and supplies the added data of each pixel block PB to the input control unit 401 of the digital signal processing unit 209.

The input control unit 401 supplies the added data of each pixel block PB to the correction processing unit 402.

The correction unit 412 corrects the added data of each pixel block PB on the basis of the correction function of each pixel block PB. Note that in a case in which an online calibration process to be described below has not yet been executed, for example, a default correction function or a correction function used finally in a previous imaging process is used.

In addition, the correction unit 412 generates low-resolution image data in which the corrected data of each pixel block PB is arranged in the array order of the pixel blocks PB. The correction unit 412 supplies the low-resolution image data to the event detection unit 403 and the exposure control unit 405.

In step S102, the correction function generation unit 423 determines whether or not the online calibration is executed. In a case in which an execution condition of the online calibration is satisfied, the correction function generation unit 423 determines that the online calibration process is executed and the process proceeds to step S103.

Note that any execution condition of the online calibration can be set.

For example, when the imaging device 100 is powered on, when the imaging device 100 returns from a standby state, and when the normal mode transitions to the sensing mode, the online calibration is executed.

For example, the online calibration is executed in accordance with a predetermined execution schedule. Thus, for example, the online calibration is executed periodically (for example, hourly).

In addition, for example, the online calibration is executed on the basis of the ambient temperature. For example, in a case in which the ambient temperature reaches a predetermined temperature, a case in which the ambient temperature is changed by a predetermined threshold or more from the time of execution of a previous online calibration, or the like, the online calibration is executed.

Further, for example, in a case in which an instruction to execute the online calibration is given by the user via the manipulation unit 105, the online calibration is executed.

In step S103, the imaging device 100 executes the online calibration process.

<Online Calibration Process>

Figure 19:
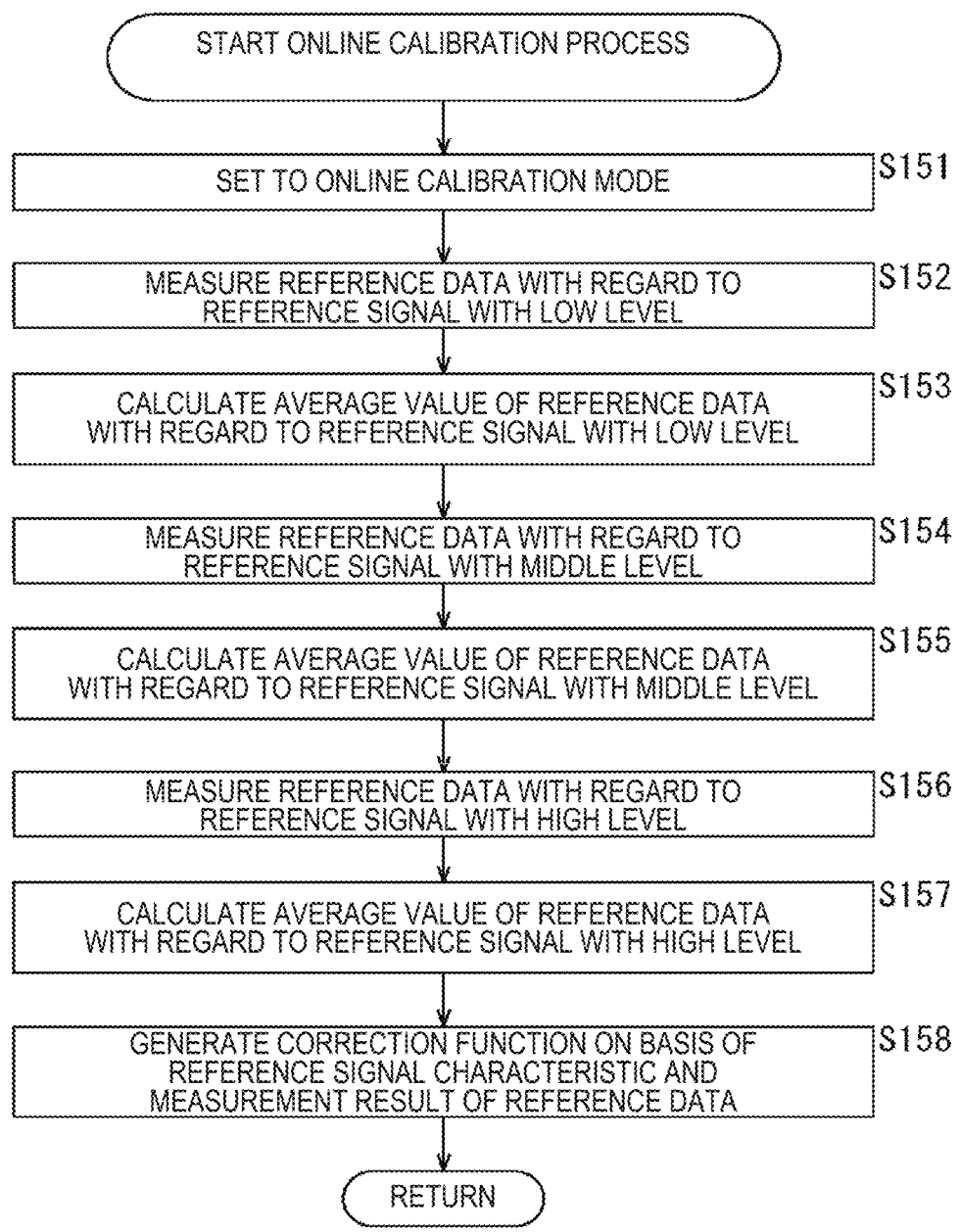
FIG. 19 is a flowchart for describing an online calibration process.

Here, the details of the online calibration process will be described with reference to the flowchart of FIG. 19.

In step S151, the image sensor 102 is set to the online calibration mode. The mode control unit 404 supplies a mode signal indicating the set online calibration mode to the input control unit 401, the correction processing unit 402, and the control unit 202. Then as in the process of step S9 of FIG. 14, the signal to be supplied to the analog signal processing unit 206 is switched from the added signal to the reference signal.

Figure 14:
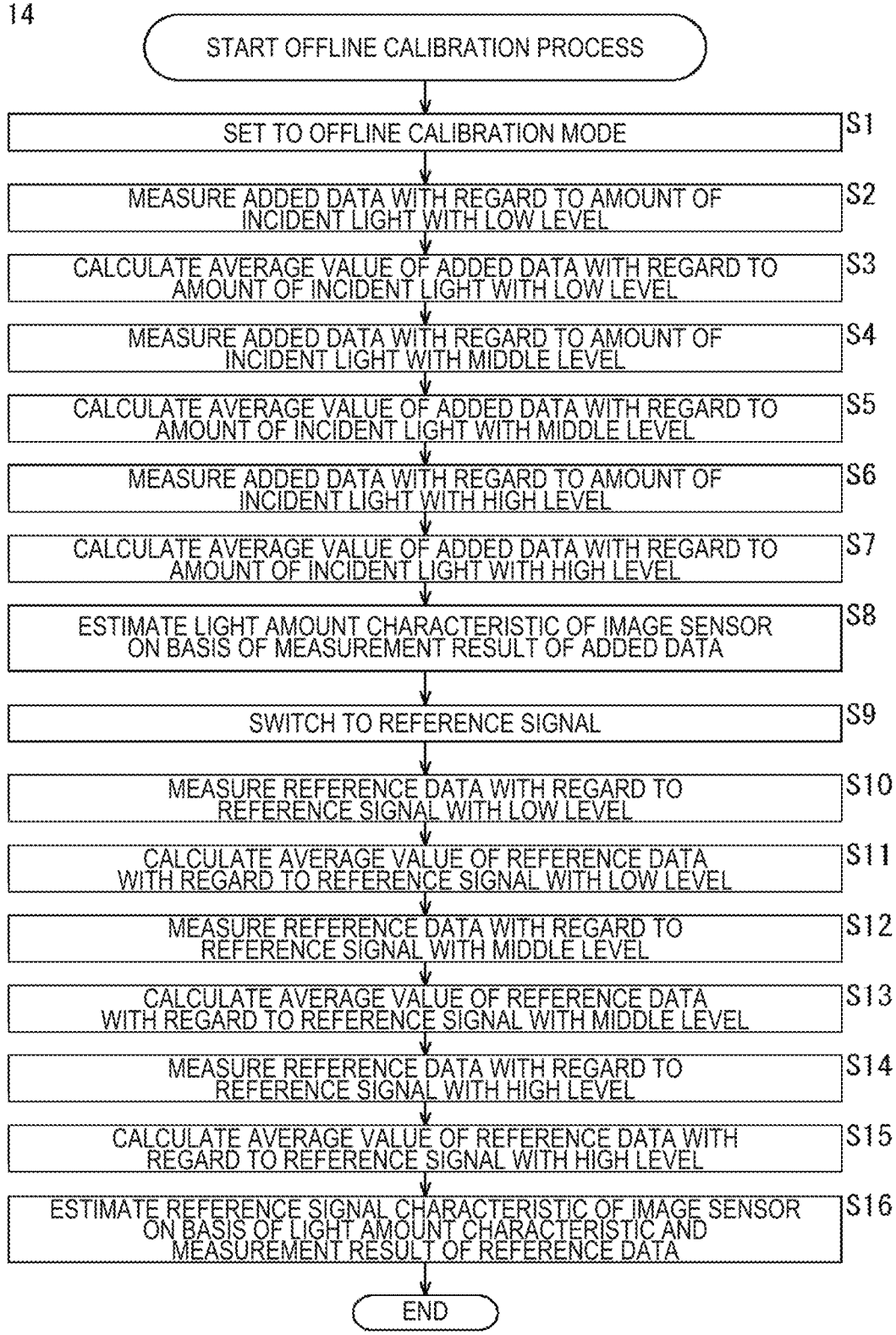
FIG. 14 is a flowchart for describing an offline calibration process.

In steps S152 to S157, the correction function generation unit 423 executes processes similar to steps S10 to S15 of FIG. 14.

Thus, the reference data of each pixel block PB with regard to the reference signals with the levels of three stages is measured and the average value of the reference data is calculated.

In step S158, the correction function generation unit 423 generates the correction function on the basis of the reference signal characteristic and the measurement result of the reference data.

Here, an example of a method of generating the correction function will be described with reference to FIG. 20.

FIG. 20A illustrates a graph of the same reference signal characteristic function fb1$a$ and reference signal characteristic function fb2$a$ as those of FIG. 16A.

FIG. 21B illustrates a graph of a correction function fc1$a$ of the pixel block PB1 and a correction function fc2$a$ of the pixel block PB2. The horizontal axis represents added data (an output value of the ADC 321) x and the vertical axis represents corrected data y.

For example, for the pixel block PB1, reference data (an average value of the reference data) x31L with regard to the reference signal with a low level, reference data (an average value of the reference data) x31M with regard to the reference signal with a middle level, and reference data (an average value of the reference data) x31H with regard to the reference signal with a high level can be obtained through the processes of steps S152 to S157. On the other hand, for the pixel block PB1, illumination YL1 equivalent to the reference signal with the low level, illumination YM1 equivalent to the reference signal with the middle level, and illumination YH1 equivalent to the reference signal with the high level are obtained based on the reference signal characteristic table stored in the nonvolatile memory 431.

Thus, the reference data x31L is associated with the illumination YL1, the reference data x31M is associated with the illumination YM1, and the reference data x31H is associated with the illumination YH1. In FIG. 21B, points P31L, P31M, and P31H are points corresponding to combinations of the reference data x31L and the illumination YL1, the reference data x31M and the illumination YM1, and the reference data x31H and the illumination YH1, respectively.

Then, a correction function fc1$a$ of the pixel block PB1 is generated through quadratic interpolation based on the points P31L, P31M, and P31H.

In addition, for example, for the pixel block PB2, reference data (an average value of the reference data) x32L with regard to the reference signal with a low level, reference data (an average value of the reference data) x32M with regard to the reference signal with a middle level, and reference data (an average value of the reference data) x32H with regard to the reference signal with a high level can be obtained through the processes of steps S152 to S157. On the other hand, for the pixel block PB2, illumination YL2 equivalent to the reference signal with the low level, illumination YM2 equivalent to the reference signal with the middle level, and illumination YH2 equivalent to the reference signal with the high level are obtained based on the reference signal characteristic table stored in the nonvolatile memory 431.

Thus, the reference data x32L is associated with the illumination YL2, the reference data x32M is associated with the illumination YM2, and the reference data x32H is associated with the illumination YH2. In FIG. 21B, points P32L, P32M, and P32H are points corresponding to combinations of the reference data x32L and the illumination YL2, the reference data x32M and the illumination YM2, and the reference data x32H and the illumination YH2, respectively.

Then, a correction function fc2$a$ of the pixel block PB2 is generated through quadratic interpolation based on the points P32L, P32M, and P32H.

Similarly, a correction function of each pixel block PB is generated.

Then, the correction function generation unit 423 supplies data (for example, a coefficient of the interpolation function) indicating the correction function of each pixel block PB to the correction unit 412.

Thereafter, the online calibration process ends. Through the online calibration, a variation in the characteristic of the ADC 321 of the AD conversion unit 207 and the logarithmic conversion circuit 311 and the voltage conversion circuit 312 of the analog signal processing unit 206 in which an influence of temperature is large is mainly calibrated.

Referring back to FIG. 18, in step S104, the sensing mode is set as in the process of step S101.

Thereafter, the process proceeds to step S105.

Conversely, in a case in which the execution condition of the online calibration is not satisfied in step S102, the correction function generation unit 423 determines that the online calibration process is not executed. The processes of steps S103 and S104 are skipped and the process proceeds to step S105.

In step S105, the event detection unit 403 determines whether or not an event occurs. The event detection unit 403 executes a process of detecting a predetermined event on the basis of the low-resolution image data. In a case in which the event detection unit 403 does not detect the predetermined event, it is determined that the event does not occur. The process returns to step S102.

Thereafter, the processes of steps S102 to S105 are repeatedly executed until it is determined in step S105 that the event occurs. Thus, whenever the predetermined execution condition is satisfied during the sensing mode, the online calibration is executed.

Conversely, in a case in which the event detection unit 403 detects the predetermined event in step S105, it is determined that the event occurs and the process proceeds to step S106.

In step S106, the imaging device 100 executes exposure control.

Specifically, the event detection unit 403 notifies the mode control unit 404 and the exposure control unit 405 that the event occurs.

The exposure control unit 405 sets an appropriate exposure amount on the basis of the corrected data of each pixel of the latest low-resolution image data. For example, brightness of a subject and a background is detected on the basis of the low-resolution image data and an exposure amount in accordance with the detected brightness is set. In this case, the image sensor 102, in particular, the pixel array portion 201, is used as an illumination meter for exposure control.

Note that the method of calculating the exposure amount is not particularly limited.

The exposure control unit 405 sets an exposure time (shutter speed) and a gain (sensitivity) of the image sensor 102 and the size of the diaphragm of the optical unit 101 on the basis of the calculated exposure amount. At this time, control amounts of the exposure time, the gain, and the size of the diaphragm are distributed so that the exposure amount reaches a target value while suppressing noise or deviation of an image.

The exposure control unit 405 supplies an exposure control signal indicating the set exposure time and gain to the control unit 202 of the image sensor 102. Thus, the exposure time and the gain of the image sensor 102 are set to the set values.

In addition, the exposure control unit 405 supplies the exposure control signal indicating the set size of the diaphragm to the optical unit 101. Thus, the size of the diaphragm of the optical unit 101 is set to the set value.

In step S107, the imaging device 100 is set to the normal mode. The mode control unit 404 supplies the mode signal indicating the set normal mode to the input control unit 401, the correction processing unit 402, and the control unit 202.

Thus, a process of photographing a high-resolution image is started. Specifically, the following process is started.

The pixel array portion 201 generates a pixel signal of each pixel 301 and supplies the generated pixel signal to the input control unit 205.

The input control unit 205 supplies the pixel signal of each pixel 301 to the AD conversion unit 207 via the analog signal processing unit 206.

The AD conversion unit 207 converts an analog pixel signal of each pixel 301 into digital pixel data and supplies the image data of each pixel 301 to the input control unit 401 of the digital signal processing unit 209.

The input control unit 401 supplies the pixel data of each pixel 301 to the image processing unit 406.

The image processing unit 406 generates high-resolution image data in which the pixel data of each pixel 301 is arranged in the array order of the pixels 301. The image processing unit 406 supplies the high-resolution image data to the DSP circuit 103.

The DSP circuit 103 executes predetermined digital signal processing on the high-resolution image data. The DSP circuit 103 supplies the processed high-resolution image data to the display unit 104 and causes an image based on the high-resolution image data to be displayed or to be supplied and recorded on the recording unit 107.

In step S108, the mode control unit 404 determines whether or not the normal mode ends. The determination process is repeatedly executed until it is determined that the normal mode ends. Then, for example, in a case in which an ending condition of the normal mode is satisfied, the mode control unit 404 determines that the normal mode ends, and then the process returns to step S101.

The ending condition of the normal mode is set based on, for example, a time or an amount of recorded high-resolution image data. For example, when a time or an amount of high-resolution image data necessary for analysis of the event is recorded, it is determined that the ending condition of the normal mode is satisfied.

In addition, the ending condition of the normal mode is set based on, for example, whether the event occurs. For example, in a case in which the detected event ends, it is determined that the ending condition of the normal mode is satisfied. In this case, for example, the event detection unit 403 continues the process of detecting the event on the basis of the high-resolution image data in the normal mode.

Further, for example, in a case in which an instruction to end the normal mode is given by the user via the manipulation unit 105, it is determined that the ending condition of the normal mode is satisfied.

Thereafter, the process subsequent to step S101 is executed.

As described above, the online calibration is executed a suitable time, and the process of imaging the low-resolution image and the process of detecting the event are executed during the sensing mode while updating the correction function of each pixel block PB.

Thus, the correction function of each pixel block PB is appropriately adjusted in accordance with ambient temperature.

Figure 21:
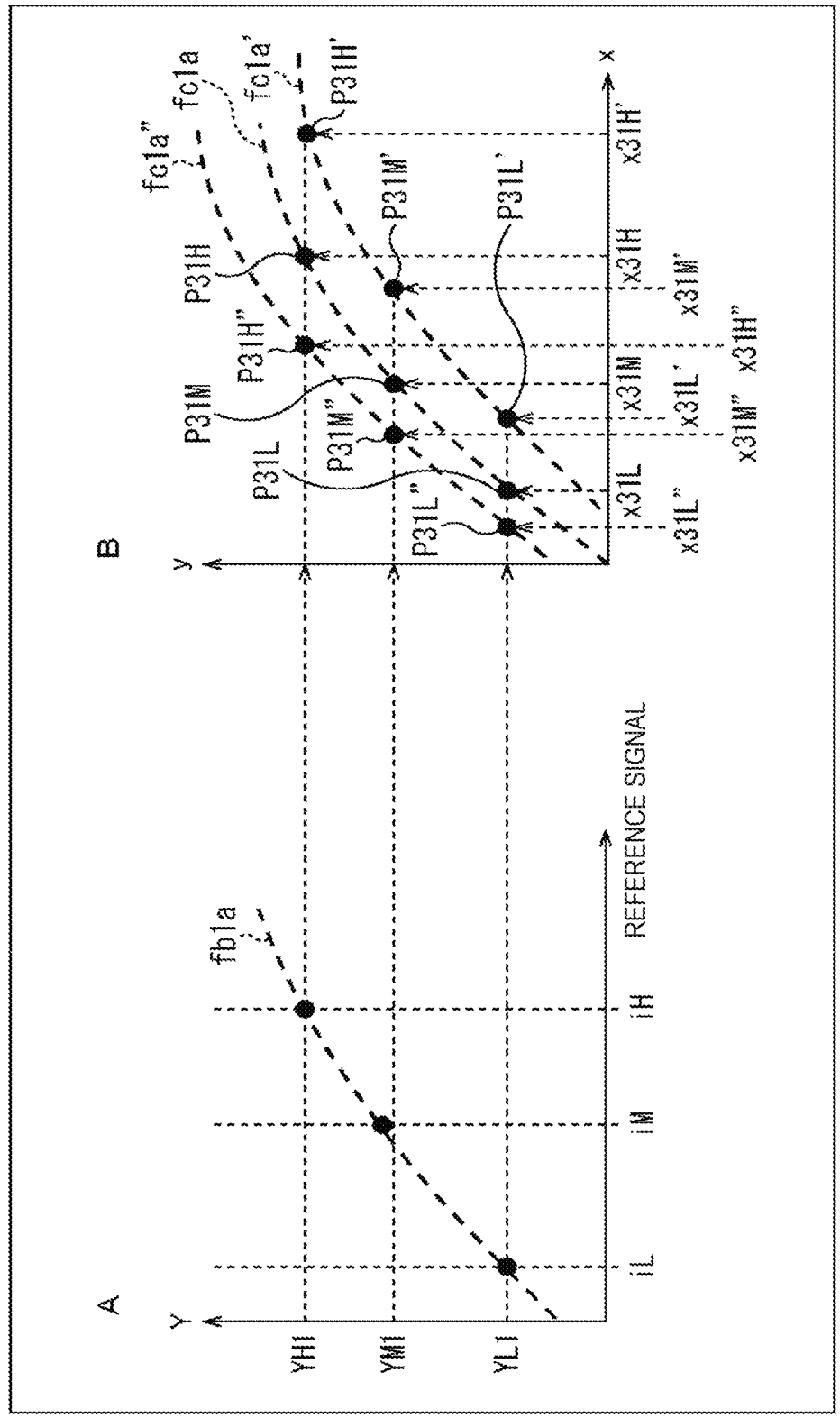
FIG. 21 is a diagram illustrating an example of a temperature characteristic of the correction function of the pixel block.

Here, an example of the calibration of the correction function will be described with reference to FIG. 21.

FIG. 21A illustrates a graph of a light amount characteristic function as in FIG. 20A. Specifically, FIG. 21A illustrates a graph of the reference signal characteristic function fb1$a$ of the pixel block PB1.

FIG. 21B illustrates a graph of the correction function as in FIG. 20B. Specifically, FIG. 21B illustrates a graph of the correction function of the pixel block PB1. The correction function fc1$a$ is the same as the correction function fc1$a$ of FIG. 20B and is, for example, a correction function of the pixel block PB1 in a case in which the ambient temperature is 27 degrees.

For example, in a case in which the ambient temperature is changed from 27 degrees to 0 degrees, the reference data measured with regard to the reference signal with each level is changed from the reference data x31L, the reference data x31M, and the reference data 31H to reference data x31L', reference data x31M', and reference data 31H', respectively. In this case, a correction function fc1$a$' is generated on the basis of a point P31L' corresponding to the combination of the reference data x31L' and the illumination YL1, a point P31M' corresponding to the combination of the reference data x31M' and the illumination YM1, and a point P31L' corresponding to the combination of the reference data x31H' and the illumination YH1.

In addition, for example, in a case in which the ambient temperature is changed from 27 degrees to 40 degrees, the reference data measured with regard to the reference signal with each level is changed from the reference data x31L, the reference data x31M, and the reference data 31H to reference data x31L", reference data x31M", and reference data 31H", respectively. In this case, a correction function fc1$a$" is generated on the basis of a point P31L" corresponding to the combination of the reference data x31L" and the illumination YL1, a point P31M" corresponding to the combination of the reference data x31M" and the illumination YM1, and a point P31L" corresponding to the combination of the reference data x31H" and the illumination YH1.

In this way, the correction function of each pixel block PB is appropriately adjusted in accordance with the ambient temperature, and thus even when the light amount characteristic of each pixel block PB is changed in accordance with the ambient temperature, the corrected data obtained with regard to the same amount of incident light is substantially constant. In addition, a variation in the light amount characteristic between the pixel blocks PB is corrected and the corrected data obtained with regard to the same amount of incident light is substantially constant between the pixel blocks PB.

Thus, the quality of the low-resolution image data is improved and detection precision of the event is improved.

In addition, the exposure of the imaging device 100 can be appropriately adjusted before the sensing mode transitions to the normal mode, and thus the high-resolution image data can be acquired from the first frame through the appropriate exposure.

Figure 22:
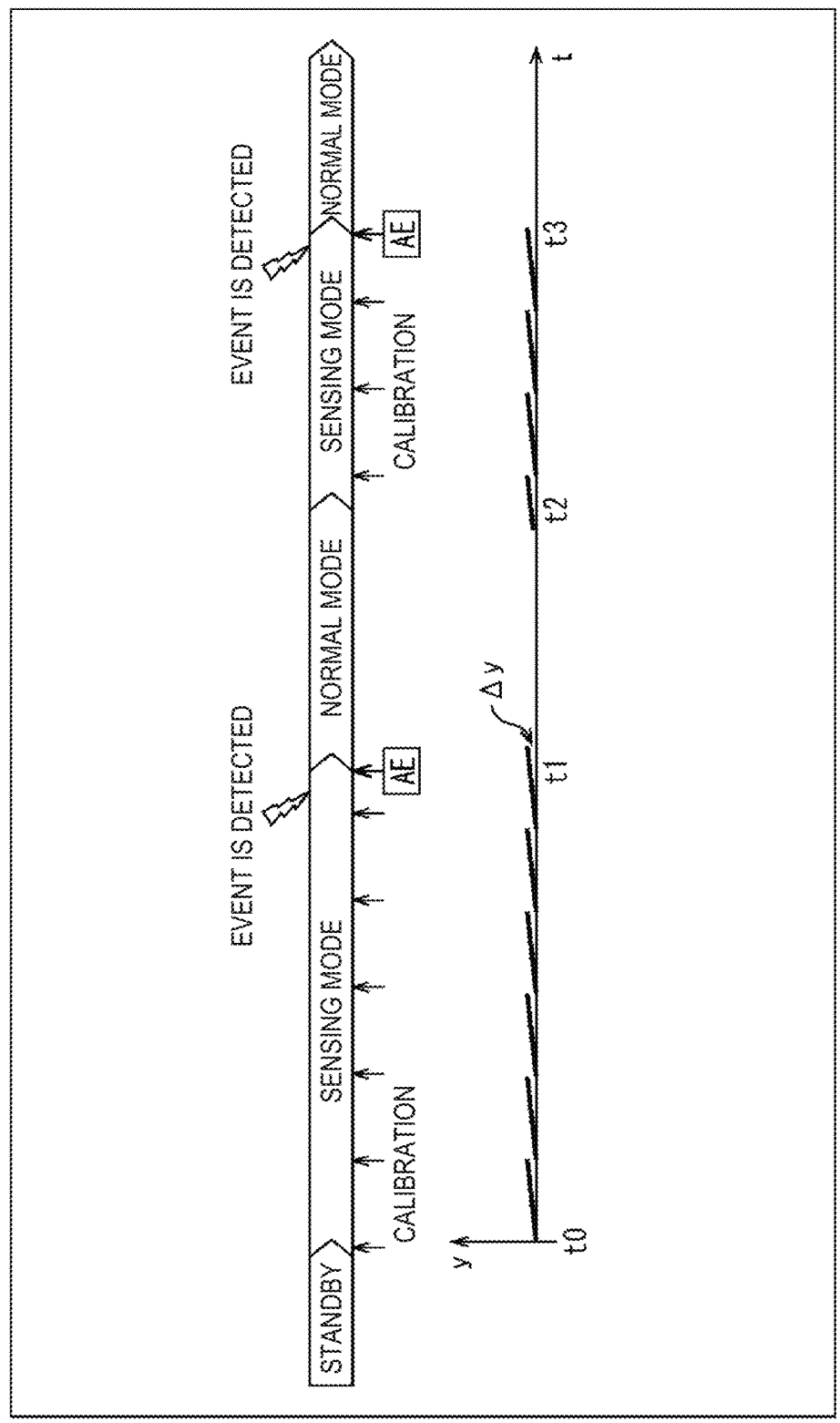
FIG. 22 is a diagram illustrating a change in corrected data during the sensing mode in a case in which the present technology is applied.

Specifically, the lower drawing of FIG. 22 is a graph indicating an example of a change in the corrected data y with respect to the same amount of incident light as that during the sensing mode, as in the lower drawing of FIG. 13.

In this way, the online calibration is executed appropriately during the sensing mode, so that the value of the corrected data y with regard to the same amount of incident light is maintained to be substantially constant. Thus, a difference Δy between the value of the corrected data y at time t0 at the time of starting of the sensing mode and the corrected data y at time t1 at the time of ending of the sensing mode becomes very small.

Accordingly, in a case in which the automatic exposure control is executed on the basis of the corrected data y, the exposure control amount of the imaging device 100 is substantially the same at time t0 and time t1 even when the amount of incident light (brightness of a subject or a background) is the same.

Accordingly, before the sensing mode transitions to the normal mode, the exposure control of the imaging device 100 is appropriately executed.

In addition, by repeating the online calibration during the sensing mode, the exposure control can be executed quickly and appropriately even when the online calibration is not executed at the time of the transition to the normal mode.

Further, the added signal has a broad dynamic range since the added signal is a logarithmically converted signal. Accordingly, by executing the exposure control on the basis of the corrected data generated on the basis of the added signal, it is possible to broaden a range of the brightness with which the exposure control can be executed with high precision.

In addition, in the sensing mode, a processing load or power consumption is reduced by performing the process of detecting the event on the basis of the low-resolution image data with a small number of pixels.

Further, since the reference signal is used in the online calibration, it is not necessary to provide a thermometer or a light source for calibration in the imaging device 100. Accordingly, it is possible to achieve miniaturization, low cost, and power saving of the imaging device 100. In addition, since no light source is used, online calibration can be executed with high precision without an influence of disturbance light.

2. Second Embodiment

Next, a second embodiment of the present technology will be described with reference to FIG. 23.

The second embodiment is an embodiment in a case in which a reference signal of each pixel block PB is proportional to an amount of incident light.

Figure 16:
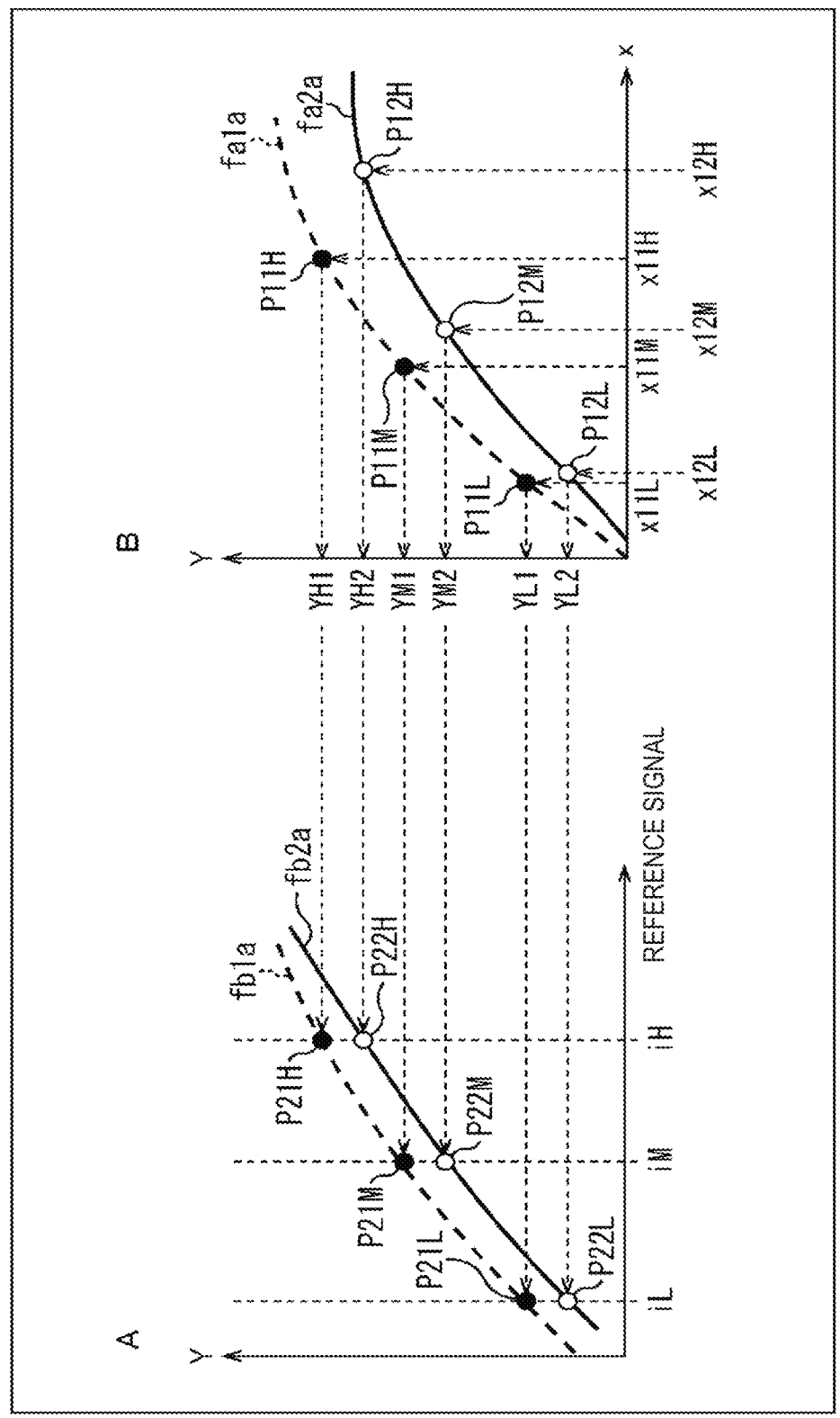
FIG. 16 is a diagram illustrating a first example of a relation between the light amount characteristic function and a reference signal characteristic function of the pixel block.
Figure 23:
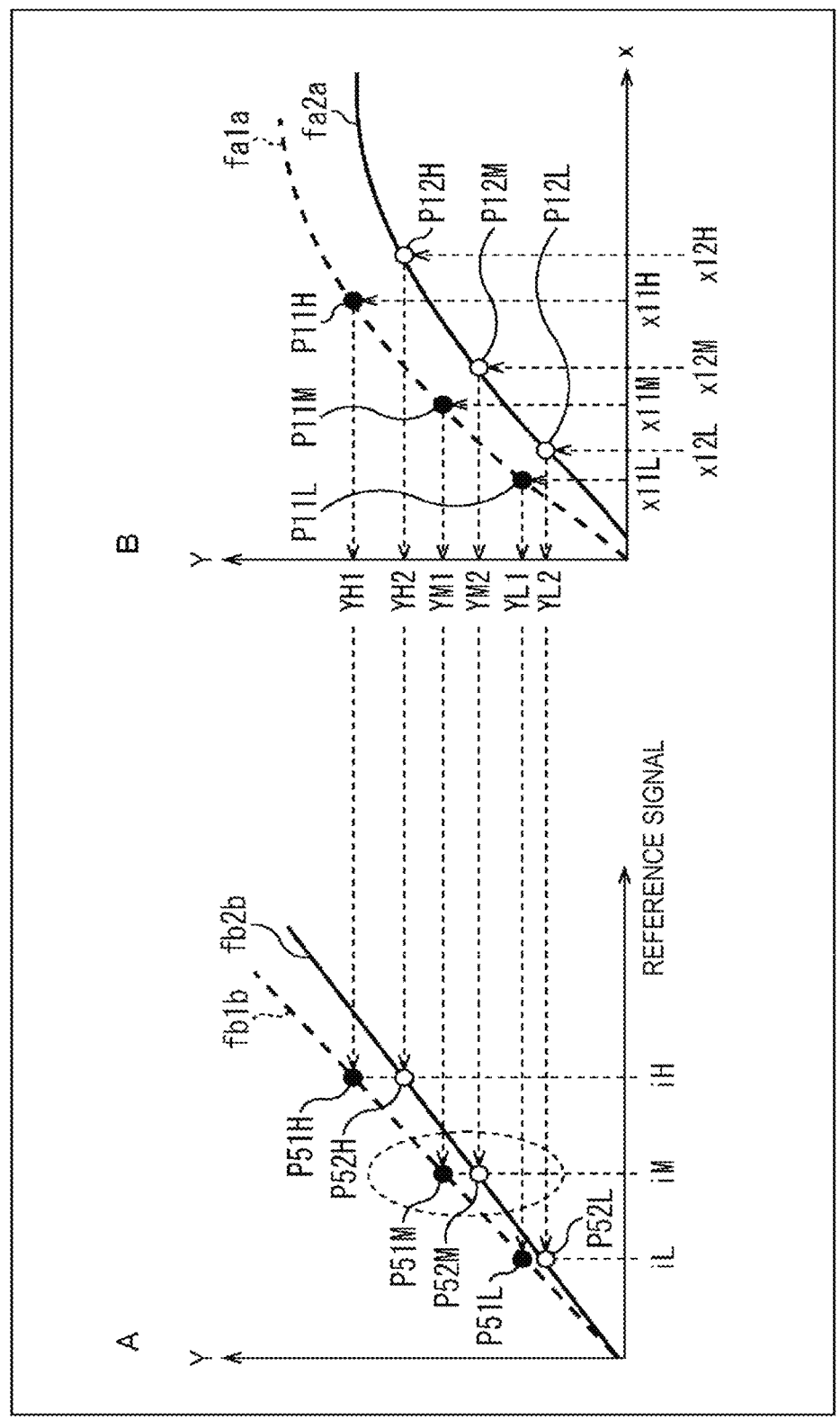
FIG. 23 is a diagram illustrating a second example of relations between the light amount characteristic functions and the reference signal characteristic functions of the pixel blocks.

FIG. 23 illustrates a relation between light amount characteristic functions and reference signal characteristic functions as in FIG. 16. FIG. 23A illustrates a graph of a reference signal characteristic function fb1b of the pixel block PB1 and a reference signal characteristic function fb2b of the pixel block PB2. The reference signal characteristic functions fb1b and fb2b are proportional functions. That is, in the pixel blocks PB1 and PB2, a reference signal is proportional to illumination (amount of incident light).

FIG. 23B illustrates a graph of the same light amount characteristic function fa1a and light amount characteristic function fa2a as those of FIG. 16B.

In this case, for example, when illumination with regard to a reference signal with a certain level is known, illumination with regard to reference signals with other levels can be obtained by calculation.

For example, in a case in which reference data (an average value of the reference data) x11M of the pixel block PB1 with regard to the reference signal with the middle level is measured, the illumination YM1 of the pixel block PB1 equivalent to the reference signal with the middle level is obtained by substituting the reference data x11M into the light amount characteristic function fa1a.

Then, the reference signal characteristic function fb1b is estimated on the basis of a point P51M corresponding to a combination of the illumination YM1 and the current value iM of the reference signal with the middle level. In addition, since the current value iL of the reference signal with the low level is known, the illumination YL1 of the pixel block PB1 equivalent to the reference signal with the low level is calculated by substituting the current value iL into the reference signal characteristic function fb1b. Similarly, since the current value iH of the reference signal with the high level is known, the illumination YH1 of the pixel block PB1 equivalent to the reference signal with the high level is calculated by substituting the current value iH into the reference signal characteristic function fb1b.

Accordingly, by merely measuring the reference data x11M with regard to the reference signal with the middle level, it is possible to estimate the illumination of the pixel block PB11 equivalent to the reference signal with each level. In addition, only the illumination YM1 corresponding to the reference signal with the middle level may be recorded in the reference signal characteristic table, and it is not necessary to record the illumination YL1 and the illumination YH1 corresponding to the reference signals with the low level and the high level.

Similarly, even for the pixel block PB12, by merely measuring reference data x12M with regard to a reference signal with the middle level, it is possible to estimate the illumination of the pixel block PB12 equivalent to the reference signal with each level. In addition, only the illumination YM2 corresponding to the reference signal with the middle level may be recorded in the reference signal characteristic table, and it is not necessary to record the illumination YL2 and the illumination YH2 corresponding to the reference signals with the low level and the high level.

In this way, in a case in which the amount of incident light of each pixel block PB and the reference signal have a proportional relation, the online calibration process, in particular, the process of estimating the reference signal characteristic of each pixel block PB, is lightened. In addition, the amount of data of the reference signal characteristic table can be reduced. As a result, it is possible to reduce the capacity of the nonvolatile memory 431.

3. Third Embodiment

Next, a third embodiment of the present technology will be described with reference to FIGS. 24 to 26.

The third embodiment is an embodiment in a case in which not only is the reference signal of each pixel block PB proportional to an amount of incident light, as in the second embodiment, but the light amount characteristic of each pixel block PB has linearity. Here, the fact that the light amount characteristic of each pixel block PB has the linearity means that added data substantially linearly changes with respect to the amount of incident light in each pixel block PB.

First, an example of a method of estimating a light amount characteristic of each pixel block PB will be described with reference to FIG. 24.

Figure 24:
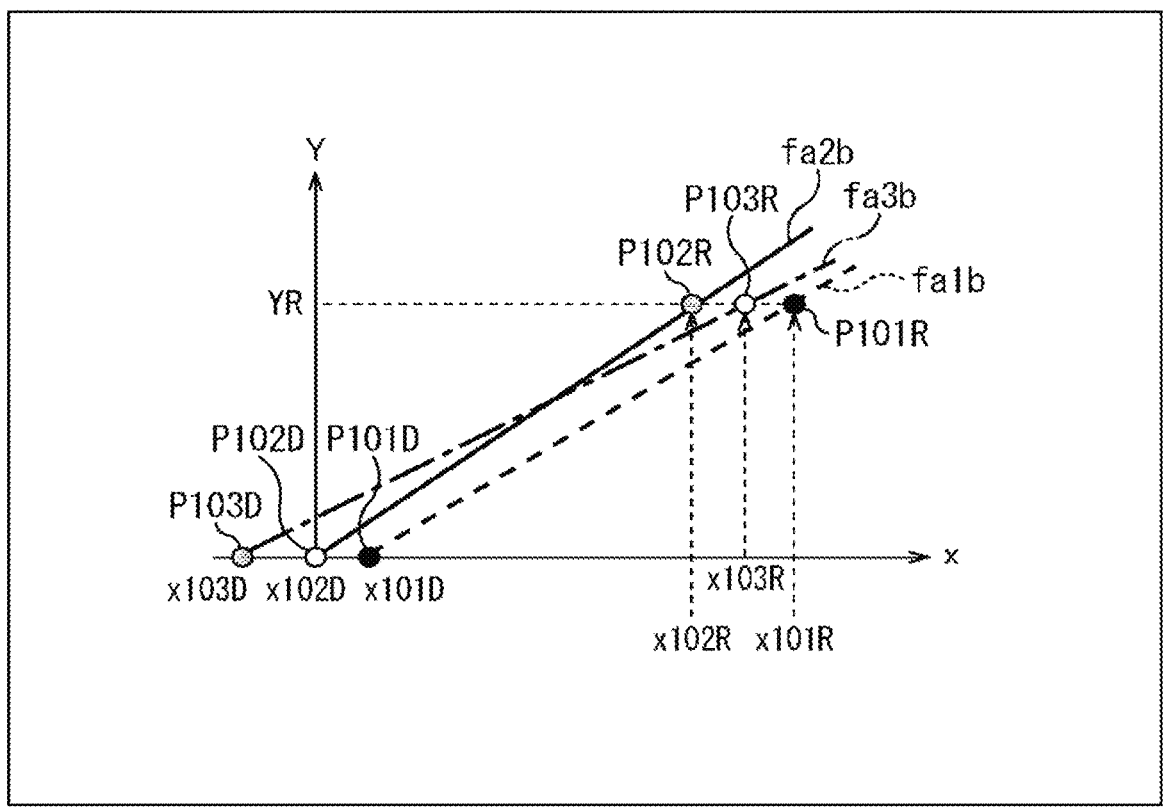
FIG. 24 is a graph illustrating a second example of the light amount characteristics of the pixel blocks.

FIG. 24 illustrates a graph of light amount characteristic functions as in FIG. 15. Specifically, FIG. 24 illustrates a graph of light amount characteristic functions fa$1b$ to fa$3b$ of the pixel blocks PB1 to PB3. The light amount characteristic functions fa$1b$ to fa$3b$ are expressed as linear functions that have linearity.

In this case, for example, a light reception surface of the pixel array portion 201 of the image sensor 102 is set substantially uniformly with illumination YR with a predetermined level by using an external light source. In this state, added data (an average value of the added data) of each pixel block PB is measured as in the above-described process. For example, added data (an average value of the added data) x101R of the pixel block PB1, added data (an average value of the added data) x102R of the pixel block PB2, and added data (an average value of the added data) x103R of the pixel block PB3 at the time of illumination TR are measured.

Subsequently, for example, a signal to be supplied to the analog signal processing unit 206 is switched from an added signal to a reference signal and the output of the reference signal is stopped. Thus, the input of the signal to the analog signal processing unit 206 is stopped and the added data in a state in which the illumination in the pixel block PB is virtually set to 0 is output from the AD conversion unit 207.

In this state, as in the above-described process, the added data (an average value of the added data) of each pixel block PB is measured. For example, added data (an average value of the added data) x101D of the pixel block PB1, added data (an average value of the added data) x102D of the pixel block PB2, and added data (an average value of the added data) x103D of the pixel block PB3 at the time of illumination of 0 are measured.

Then, the light amount characteristic function of each pixel block PB is estimated on the basis of the added data (the average value of the added data) at the time of the illumination of 0 and the added data (the average value of the added data) at the time of the illumination YR.

For example, the light amount characteristic function fa$1b$ of the pixel block PB1 is estimated through linear interpolation based on a point P101D corresponding to the added data x101D at the time of the illumination of 0 and a point P101R corresponding to the added data x101R at the time of the illumination YR. The light amount characteristic function fa$2b$ of the pixel block PB2 is estimated through linear interpolation based on a point P102D corresponding to the added data x102D at the time of the illumination of 0 and a point P102R corresponding to the added data x102R at the time of the illumination YR. The light amount characteristic function fa$3b$ of the pixel block PB3 is estimated through linear interpolation based on a point P103D corresponding to the added data x103D at the time of the illumination of 0 and a point P103R corresponding to the added data x103R at the time of the illumination YR.

The light amount characteristic functions of the other pixel blocks PB are also estimated in accordance with a similar method.

Then, data (for example, a coefficient of the light amount characteristic function) indicating the light amount characteristic function of each pixel block PB is retained in the volatile memory 432.

In this way, compared to the first embodiment, the number of times the added data is measured is reduced and the process of estimating the light amount characteristic of each pixel block PB is lightened.

Next, an example of a method of estimating the reference signal characteristic of each pixel block PB will be described with reference to FIG. 25.

Figure 25:
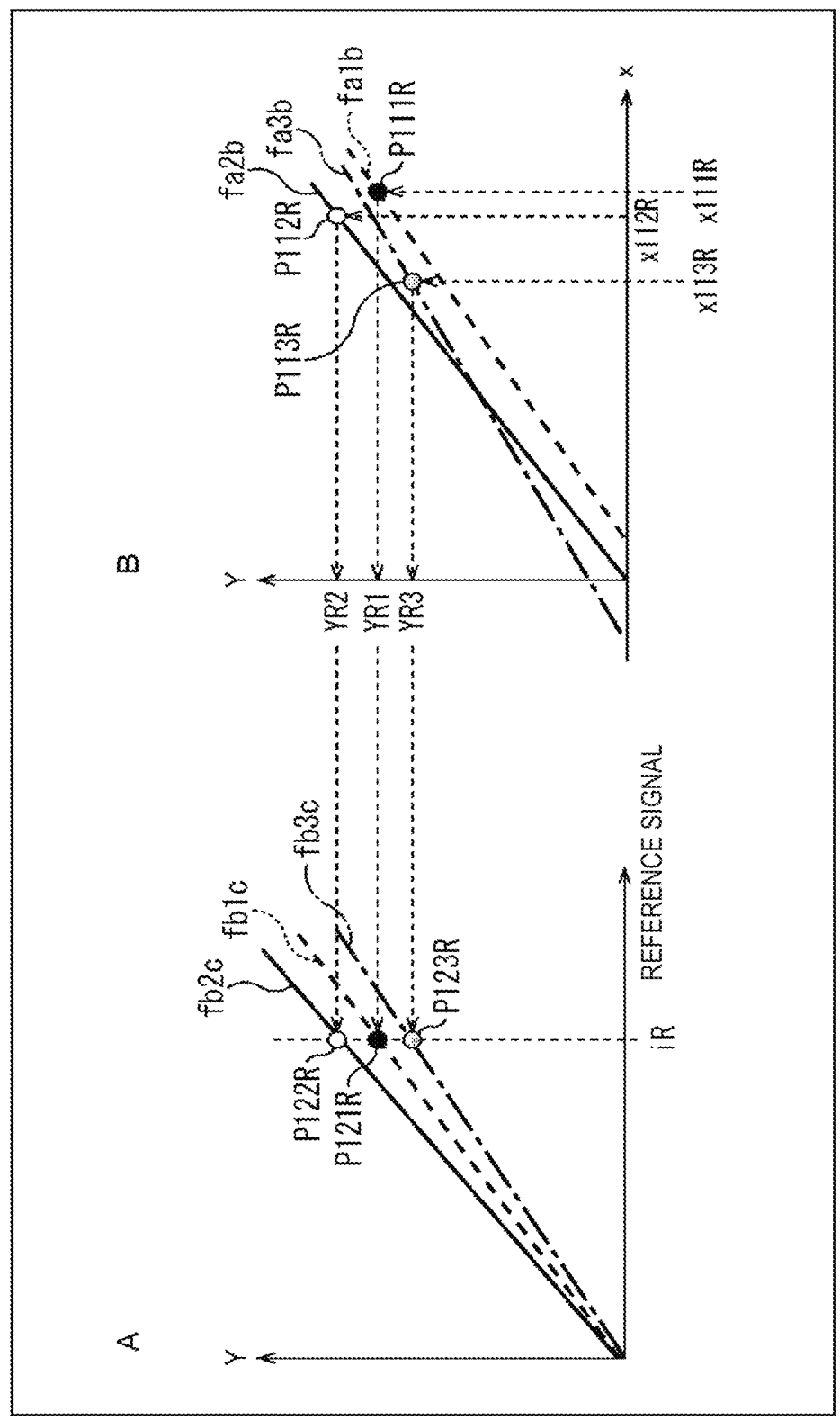
FIG. 25 is a diagram illustrating a third example of relations between the light amount characteristic functions and the reference signal characteristic functions of the pixel blocks.

FIG. 25 illustrates relations between light amount characteristic functions and reference signal characteristic functions as in FIG. 16.

FIG. 25A illustrates a graph of reference signal characteristic functions fb$1b$ to fb$3b$ of the pixel blocks PB1 to PB2. The reference signal characteristic functions fb$1b$ to f$3b$ are proportional functions. That is, in the pixel blocks PB1 to PB3, reference signals are proportional to illumination (amount of incident light).

FIG. 25B illustrates a graph of the same light amount characteristic functions fa$1b$ to fa$3b$ of the pixel blocks PB1 to PB3 as those of FIG. 24.

For example, reference data (an average value of the reference data) of each pixel block PB with regard to the reference signal with a predetermined level (current value iR) is first measured. For example, reference data (an average value of the reference data) x111R of the pixel block PB1, reference data (an average value of the reference data) x112R of the pixel block PB2, and reference data (an average value of the reference data) x113R of the pixel block PB3 with regard to the reference signal with a predetermined level are measured.

Subsequently, illumination YR1 of the pixel block PB1 equivalent to the reference signal with the predetermined level is estimated by substituting the reference data x111R into the light amount characteristic function fa$1b$. Illumination YR2 of the pixel block PB2 equivalent to the reference signal with the predetermined level is estimated by substituting the reference data x112R into the light amount characteristic function fa$2b$. Illumination YR3 of the pixel block PB3 equivalent to the reference signal with the predetermined level is estimated by substituting the reference data x113R into the light amount characteristic function fa$3b$.

Illumination equivalent to the reference signal with the predetermined level of the other pixel blocks PB is designated in accordance with a similar method.

Then, the illumination equivalent to the reference signal with the predetermined level in each pixel block PB is recorded in the reference signal characteristic table. In addition, the reference signal characteristic function of each pixel block PB is estimated in accordance with a method similar to that of the second embodiment.

In this way, compared to the first embodiment, the number of times the reference data is measured is reduced and the process of estimating the reference signal characteristic of each pixel block PB is lightened. In addition, the amount of data of the reference signal characteristic table is reduced.

Next, an example of a method of generating the correction function of each pixel block PB will be described with reference to FIG. 26.

Figure 20:
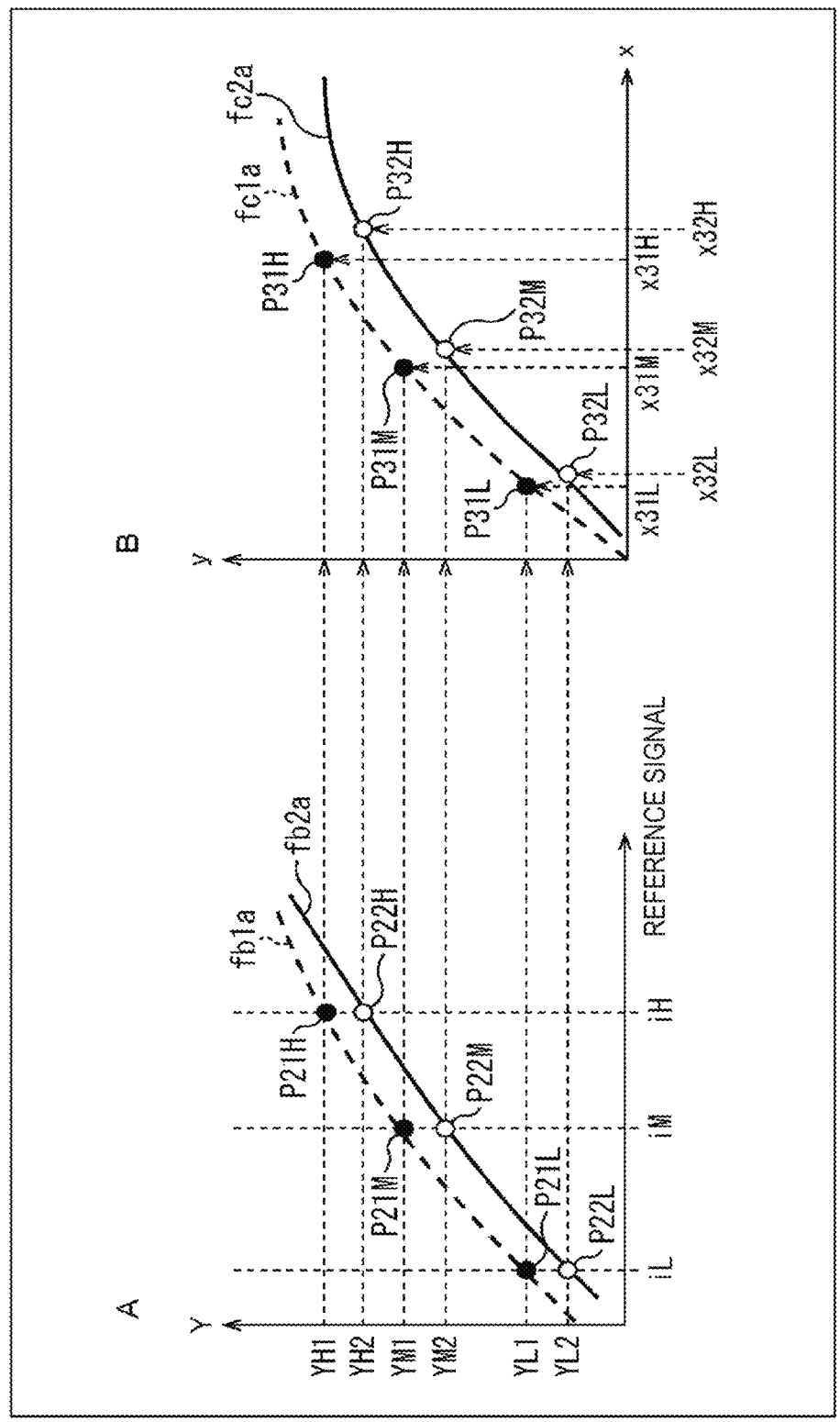
FIG. 20 is a diagram illustrating a first example of a relation between the reference signal characteristic function and a correction function of a pixel block.
Figure 26:
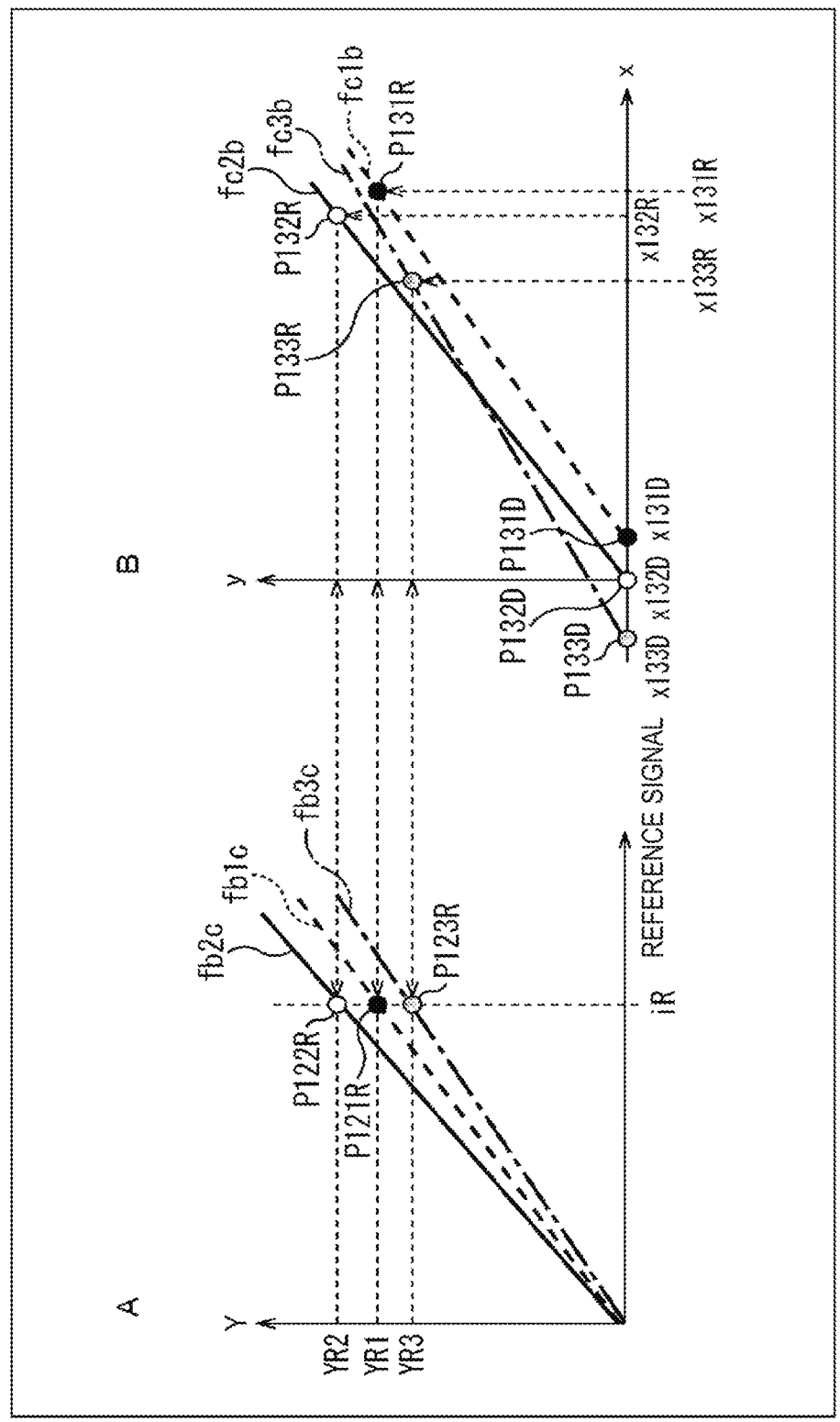
FIG. 26 is a diagram illustrating a second example of relations between the reference signal characteristic functions and the correction functions of the pixel block.

FIG. 26 illustrates relations between reference signal characteristic functions and correction functions as in FIG. 20.

FIG. 26A illustrates a graph of the same reference signal characteristic functions fb1$a$ to fb1$c$ as those of FIG. 25A.

FIG. 26B illustrates a graph of the correction functions as in FIG. 20B. Specifically, FIG. 26B illustrates a graph of correction functions fc1$b$ to fc3$b$ of the pixel blocks PB1 to PB3.

For example, reference data (an average value of the reference data) of each pixel block PB with regard to the reference signal with the same level as at the time of estimating the reference signal characteristic (current value iR) is measured. For example, reference data (an average value of the reference data) x131R of the pixel block PB1, reference data (an average value of the reference data) x132R of the pixel block PB2, and reference data (an average value of the reference data) x133R of the pixel block PB3 with regard to the reference signal with a predetermined level are measured.

Subsequently, the output of the reference signals is stopped. Thus, the input of the signal to the analog signal processing unit 206 is stopped and the reference data in the state in which the current value of the reference signal is set to 0 (at the time of a reference signal of 0) is output from the AD conversion unit 207.

In this state, reference data (an average value of the reference data) of each pixel block PB is measured. For example, reference data (an average value of the reference data) x131D of the pixel block PB1, reference data (an average value of the reference data) x132D of the pixel block PB2, and reference data (an average value of the reference data) x133D of the pixel block PB3 at the time of the reference signal of 0 are measured.

Then, the correction function of each pixel block PB is generated on the basis of the reference data at the time of the reference signal of 0 and the measurement result of the reference data with regard to the reference signal with a predetermined level.

For example, the correction function fc1$b$ of the pixel block PB1 is generated through linear interpolation based on a point P131D corresponding to the reference data x131D at the time of the reference signal of 0 and a point P131R corresponding to the reference data x131R with regard to the reference signal with the predetermined level. The correction function fc2$b$ of the pixel block PB2 is generated through linear interpolation based on a point P132D corresponding to the reference data x132D at the time of the reference signal of 0 and a point P132R corresponding to the reference data x132R with regard to the reference signal with the predetermined level. The correction function fc3$b$ of the pixel block PB3 is generated through linear interpolation based on a point P133D corresponding to the reference data x133D at the time of the reference signal of 0 and a point P133R corresponding to the reference data x133R with regard to the reference signal with the predetermined level.

For other pixel blocks PB, correction functions are also generated in accordance with a similar method.

In this way, compared to the first embodiment, the number of times the reference data is measured is reduced and the process of generating the correction function of each pixel block PB is lightened.

Note that the correction function in this case is expressed in the form of y=b1×x+b0. The coefficient b1 is a coefficient for correcting a variation in a gain of a circuit generating the added data of the pixel block PB. The coefficient b0 is a coefficient for correcting a variation in an offset characteristic of the circuit generating the added data of the pixel block PB.

4. Fourth Embodiment

Next, a fourth embodiment of the present technology will be described with reference to FIG. 27.

The fourth embodiment is an embodiment in a case in which the light amount characteristic of each pixel block PB complicatedly changes, it is difficult to approximate the light amount characteristic function to a linear function or a quadratic function, and it is consequently difficult to express the correction function as a linear function or a quadratic function. Note that in the reference signal characteristic of each pixel block PB, the reference signal and the illumination (the amount of incident light) have a proportional relation as in the second and third embodiments.

Figure 27:
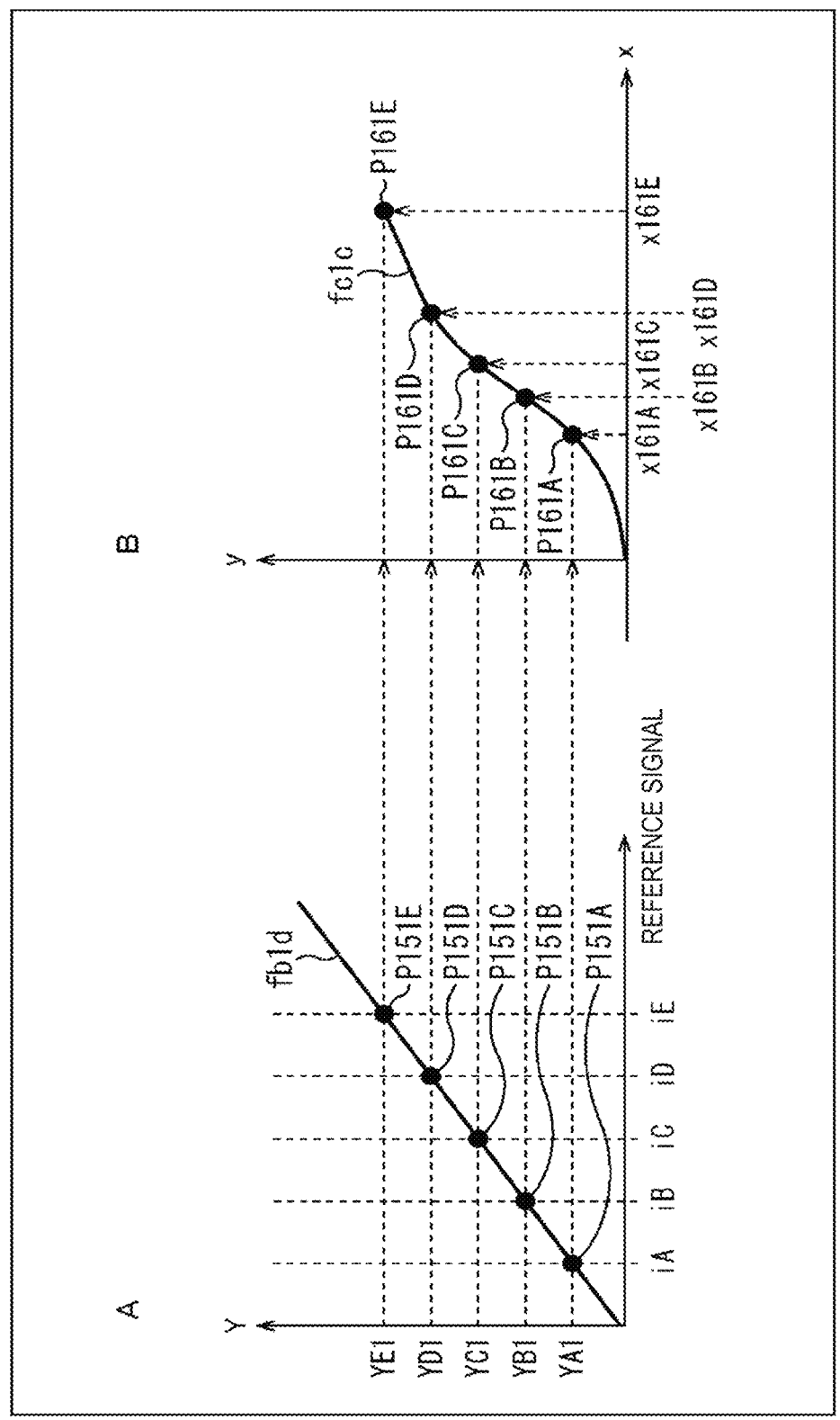
FIG. 27 is a diagram illustrating a third example of a relation between the reference signal characteristic function and the correction function of the pixel block.

FIG. 27 illustrates a relation of a reference signal characteristic function and a correction function as in FIG. 20.

FIG. 27A illustrates a graph of a reference signal characteristic function fb1$d$ of the pixel block PB1. The reference signal characteristic function fb1$d$ is a proportional function. That is, the illumination of the pixel block PB1 and the reference signal have a proportional relation.

FIG. 27B is a graph of a correction function fc1$c$ of the pixel block PB1. The correction function fc1$c$ complicatedly changes, and thus it is difficult to express the correction function fc1$c$ as a linear function or a quadratic function.

In this case, reference data (an average value of the reference data) x161A to reference data (an average value of the reference data) x161E of the pixel block PB1 with respect to reference signals with levels A to E (current values iA to iE) are measured.

In addition, for example, illumination YC1 of the pixel block PB1 equivalent to the reference signal with the level C (the current value iC) is recorded in the reference signal characteristic table. Then, a function connecting the origin to a point P151C corresponding to a combination of the current value iC and the illumination YC1 is estimated as the reference signal characteristic function fb1$d$ of the pixel block PB1.

Further, illumination YA1, illumination YB1, illumination YD1, and illumination YE1 equivalent to the reference signals with the level A, the level B, the level D, and the level E are calculated by substituting the current value iA, the current value iB, the current value iD, and the current iE into the reference signal characteristic function fb1$d$. Thus, the reference data x161A is associated with the illumination YA1, the reference data x161B is associated with the illumination YB1, the reference data x161D is associated with the illumination YD1, and the reference data x161E is associated with the illumination YE1.

Subsequently, the range of the added data is divided into a range from 0 to the reference data x161A, a range from the reference data x161A to the reference data x161B, a range from the reference data x161B to the reference data x161C, a range from the reference data x161C to the reference data x161D, and a range from the reference data x161D to the reference data x161E.

Subsequently, the linear function or the quadratic function indicating the relation between the added data x and the corrected data y in each range is generated for each of the divided ranges through linear interpolation or quadratic interpolation. Accordingly, in this case, the interpolation function of the pixel block PB1 is represented by combining the functions for each range of the added data.

The correction functions of the other pixel blocks PB are also generated in accordance with a similar method.

Then, the data (for example, coefficients of each function included in the interpolation function) indicating the interpolation function of each pixel block PB is retained in the volatile memory 432.

Thus, even in a case in which the light amount characteristic of the pixel block PB complicatedly changes, the interpolation function can be appropriately generated.

5. Modification Examples

Hereinafter, modification examples of the embodiments of the above-described present technology will be described.

In the foregoing description, the case in which the calibration of the correction function of the added data based on the added signal obtained by adding the pixel signals in units of the pixel blocks PB is executed has been exemplified. However, for example, the present technology can also be applied to a case in which the calibration of the correction function of the pixel data based on the pixel signal of each pixel is executed. For example, the online calibration can be executed using the reference signal and the correction function of each pixel can be adjusted.

In addition, in the foregoing description, the case in which the calibration of the correction function used to correct the logarithmically converted added data is executed has been exemplified. However, the present technology can also be applied to a case in which a correction function of added data or pixel data which is not logarithmically converted is calibrated.

Further, in the foregoing description, the example in which the pixel signals (the added signals) output from the pixel array portion 201 are reduced by adding the pixel signals of the plurality of pixels 301 during the sensing mode has been described, but the pixel signals may be reduced in accordance with another method. For example, the pixel signals output from the pixel array portion 201 may be reduced by decimating the pixels outputting the pixel signals, that is, by reducing the pixels outputting the pixel signals. In addition, for example, the pixel signals output from the pixel array portion 201 may be reduced by lengthening an output interval of the pixel signals.

In addition, the present technology can also be applied to, for example, a case in which the online calibration is executed during a normal imaging process.

Further, in particular, a kind, configuration, or the like of the image sensor is not limited as long as the image sensor to which the present technology can be applied is an image sensor performing the online calibration. For example, the case in which the pixel 301 has the shared pixel structure has been exemplified above, but the present technology can also be applied to an image sensor not including a pixel that has the shared pixel structure.

Figure 28:
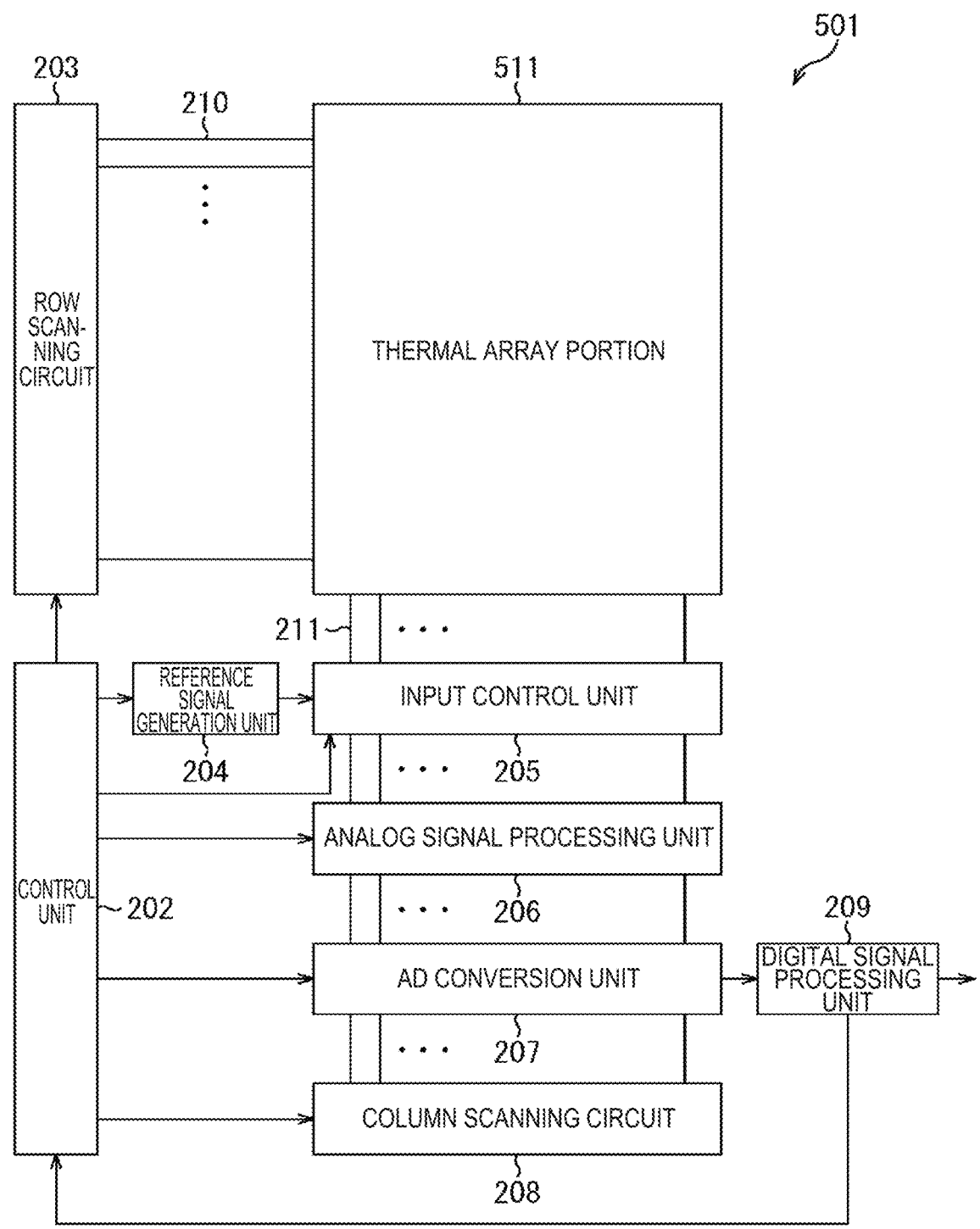
FIG. 28 is a block diagram illustrating a configuration example of a temperature detection element.

In addition, for example, the present technology can also be applied to a temperature detection element 501 in FIG. 28. Note that in the temperature detection element 501 in FIG. 28, the same reference sings are given to portions corresponding to the image sensor 102 in FIG. 2 and the description thereof will be appropriately omitted.

The temperature detection element 501 is different from the image sensor 102 in that a thermal array portion 511 is provided instead of the pixel array portion 201.

In the thermal array portion 511, for example, a thermal sensor that converts temperature into an electric signal is provided in each pixel instead of the photoelectric conversion element.

Then, in the temperature detection element 501, for example, offline calibration can be executed using an infrared (IR) light source in accordance with a method similar to that of the image sensor 102. In addition, in the temperature detection element 501, for example, the online calibration can be executed using a reference signal in a method similar to that of the image sensor 102.

Thus, it is possible to correct a variation in a detection characteristic of temperature for each pixel and realize a highly precise temperature meter function.

In addition, in the first embodiment, the example in which the light amount characteristic is estimated on the basis of the measurement result of the added data with respect to the illumination at the three stages has been described. However, for example, the light amount characteristic may be estimated on the basis of a measurement result of added data with respect to illumination at four or more stages. In addition, in the first embodiment, the example in which the correction function is generated on the basis of the measurement result of the reference data with respect to the reference signal at the three stages has been described. However, for example, a correction function may be generated on the basis of a measurement result of reference data with respect to reference signals at four or more levels.

6. Application Example of Present Technology

Figure 29:
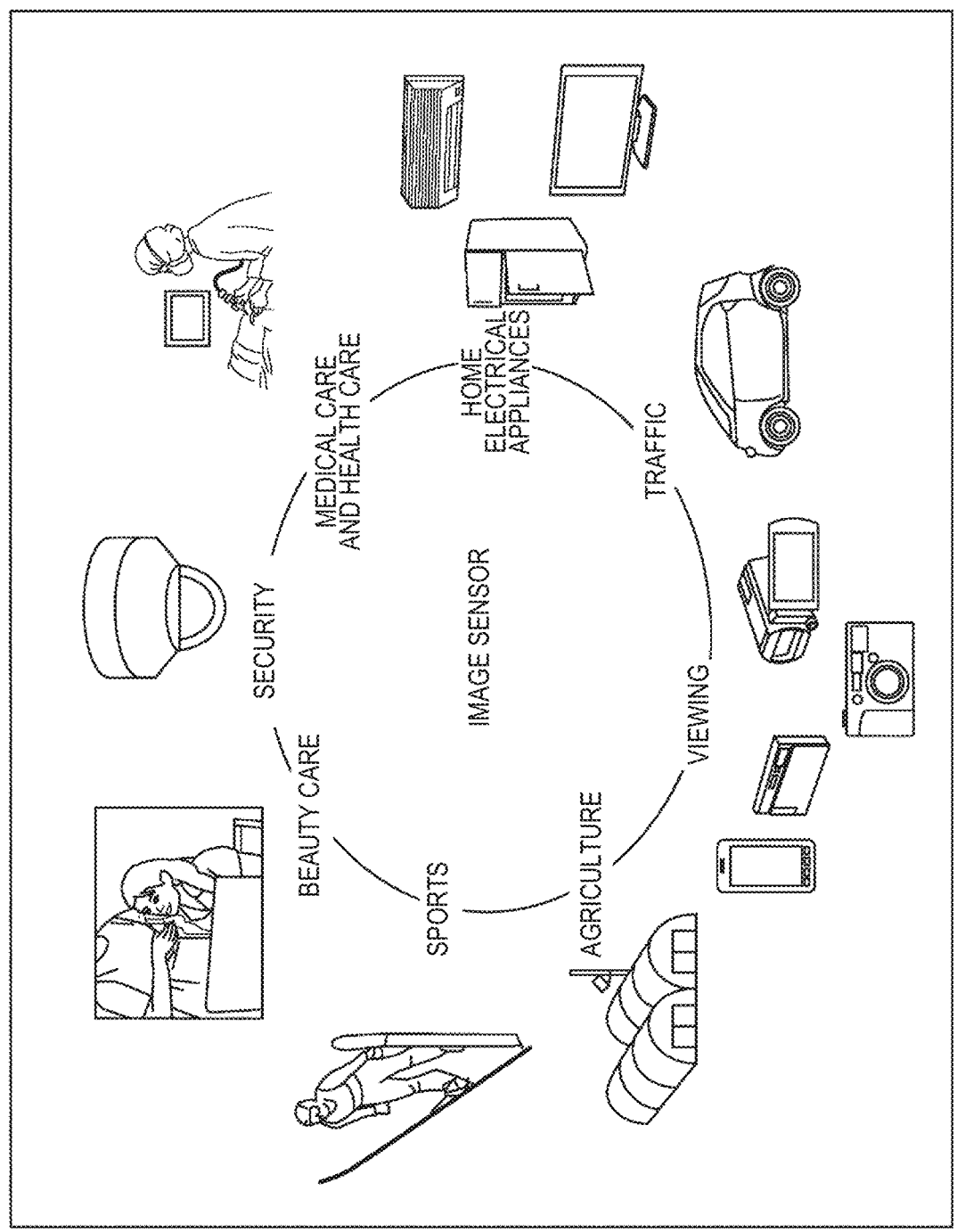
FIG. 29 is a diagram illustrating application examples of the present technology.

For example, the present technology can be applied to various cases in which light such as visible light, infrared light, ultraviolet light, or an X ray is sensed, as illustrated in FIG. 29.

- Devices that take images used for viewing, such as a digital camera and a portable appliance with a camera function.
- Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.
- Devices used for home electrical appliances, such as a TV, a refrigerator, and an air conditioner, to takes images of a gesture of a user and perform appliance operation in accordance with the gesture.
- Devices used for medical care and health care, such as an endoscope and a device that performs angiography by reception of infrared light.
- Devices used for security, such as a monitoring camera for crime prevention and a camera for personal authentication.
- Devices used for beauty care, such as skin measurement equipment that takes images of the skin and a microscope that takes images of the scalp.
- Devices used for sports, such as an action camera and a wearable camera for sports and the like.

Devices used for agriculture, such as a camera for monitoring the condition of the field.

Hereinafter, a more detailed application example will be explained.

<Example of Application to Mobile Objects>

The technology (present technology) according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

Figure 30:
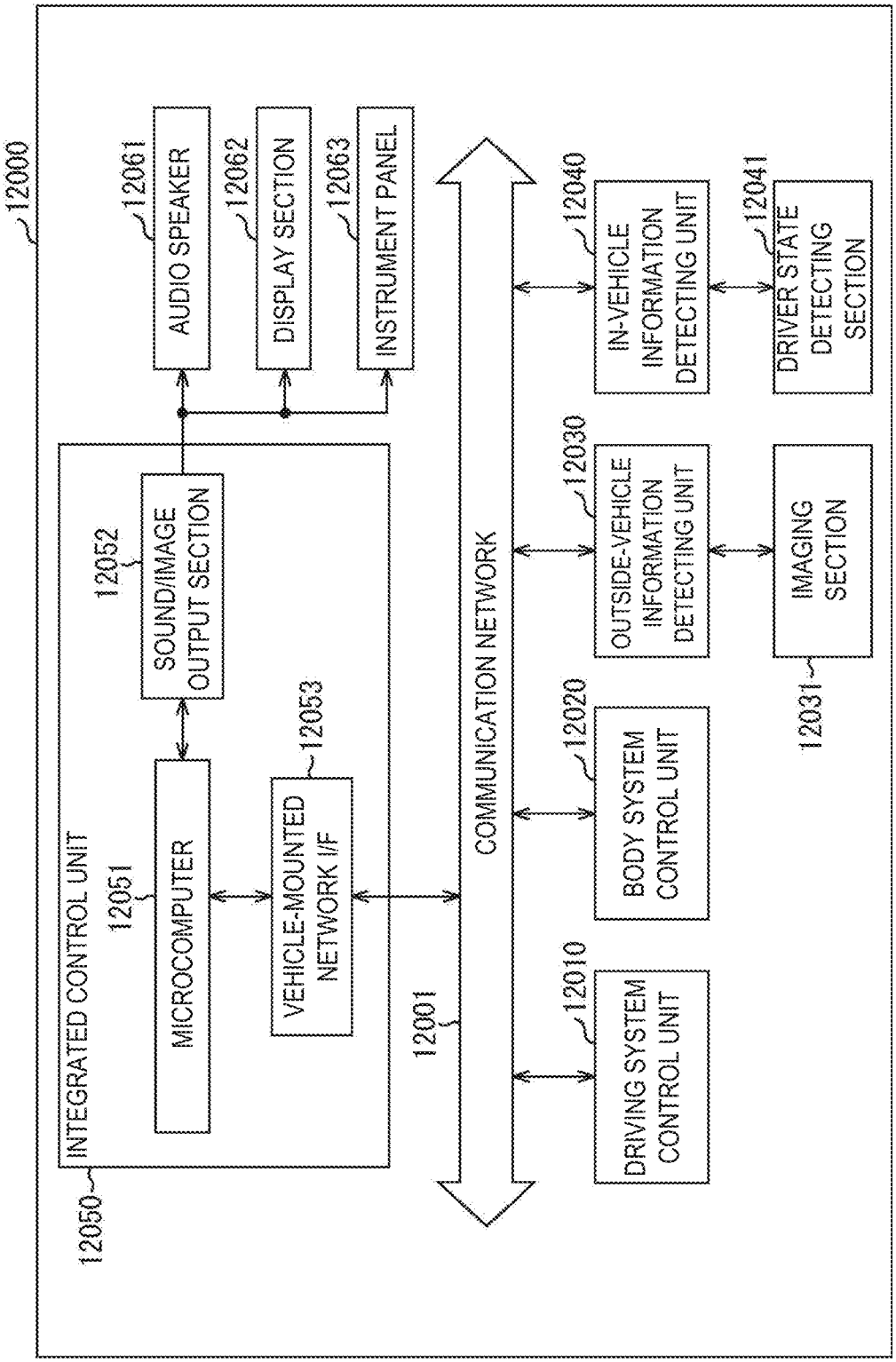
FIG. 30 is a block diagram illustrating an example of a schematic configuration of a vehicle control system.

FIG. 30 is a block diagram illustrating a schematic configuration example of a vehicle control system which is an example of a mobile object control system to which a technology according to an embodiment of the present technology is applicable.

A vehicle control system 12000 includes a plurality of electronic control units connected via a communication network 12001. In the example illustrated in FIG. 30, the vehicle control system 12000 includes a drive line control unit 12010, a body system control unit 12020, a vehicle outside information detection unit 12030, a vehicle inside information detection unit 12040, and an integrated control unit 12050. In addition, as functional configurations of the integrated control unit 12050, a microcomputer 12051, an audio and image output unit 12052, an in-vehicle network interface (I/F) 12053.

The drive line control unit 12010 controls the operation of devices related to the drive line of the vehicle in accordance with a variety of programs. For example, the drive line control unit 12010 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like.

The body system control unit 12020 controls the operations of a variety of devices attached to the vehicle body in accordance with a variety of programs. For example, the body system control unit 12020 functions as a control device for a keyless entry system, a smart key system, a power window device, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 receives these radio waves or signals, and controls the vehicle door lock device, the power window device, the lights, or the like.

The vehicle outside information detection unit 12030 detects information regarding the outside of a vehicle on which the vehicle control system 12000 is mounted. For example, an imaging unit 12031 is connected to the vehicle outside information detection unit 12030. The vehicle outside information detection unit 12030 causes the imaging unit 12031 to capture an image outside of the vehicle and receives the captured image. The vehicle outside information detection unit 12030 may perform an object detection process or a distance detection process for a person, a vehicle, an obstacle, a sign, letters on a road, or the like on the basis of the received image.

The imaging unit 12031 is a light sensor that receives light and outputs an electric signal in accordance with the amount of received light. The imaging unit 12031 can output the electric signal as an image or distance measurement information. In addition, the light received by the imaging unit 12031 may be the visible light or may be non-visible light such as infrared light.

The vehicle inside information detecting unit 12040 detects information regarding the inside of the vehicle. The vehicle inside information detecting unit 12040 is connected, for example, to a driver state detecting unit 12041 that detects the state of the driver. The driver state detecting unit 12041 may include, for example, a camera that images the driver. The vehicle inside information detecting unit 12040 may compute the degree of the driver's tiredness or the degree of the driver's concentration or determine whether the driver have a doze, on the basis of detection information input from the driver state detecting unit 12041.

For example, the microcomputer 12051 can calculate a control target value of the driving force generating device, the steering mechanism, or the braking device on the basis of information acquired by the vehicle outside information detecting unit 12030 or the vehicle inside information detecting unit 12040 on the inside and outside of the vehicle, and output a control instruction to the drive line control unit 12010. For example, the microcomputer 12051 may perform cooperative control for the purpose of executing the functions of an advanced driver assistance system (ADAS) including vehicle collision avoidance or impact reduction, follow-up driving based on the inter-vehicle distance, constant vehicle speed driving, vehicle collision warning, vehicle lane departure warning, or the like.

Further, the microcomputer 12051 can control the driving force generating device, the steering mechanism, the braking device, or the like on the basis of information acquired by the vehicle outside information detecting unit 12030 or the vehicle inside information detecting unit 12040 on the areas around the vehicle, thereby performing cooperative control for the purpose of automatic driving or the like that allows the vehicle to autonomously travel irrespective of any operation of a driver.

In addition, the microcomputer 12051 can output a control instruction to the body system control unit 12020 on the basis of the information regarding the outside of the vehicle acquired by the vehicle outside information detection unit 12030. For example, the microcomputer 12051 can control a head lamp in accordance with the position of a preceding vehicle or an oncoming vehicle detected by the vehicle outside information detection unit 12030 and can perform cooperative control for the purpose of anti-glaring such as switching a high beam to a low beam.

The audio and image output unit 12052 transmits an output signal of at least one of a sound and an image to an output device capable of visually or aurally notifying a passenger of the vehicle or the outside of the vehicle of information. In the example of FIG. 30, an audio speaker 12061, a display unit 12062, and an instrument panel 12063 are exemplified as the output device. For example, the display unit 12062 may include at least one of an onboard display and a head-up display.

The figure is a diagram illustrating an example of an installation position of the imaging unit 12031.

Figure 31:
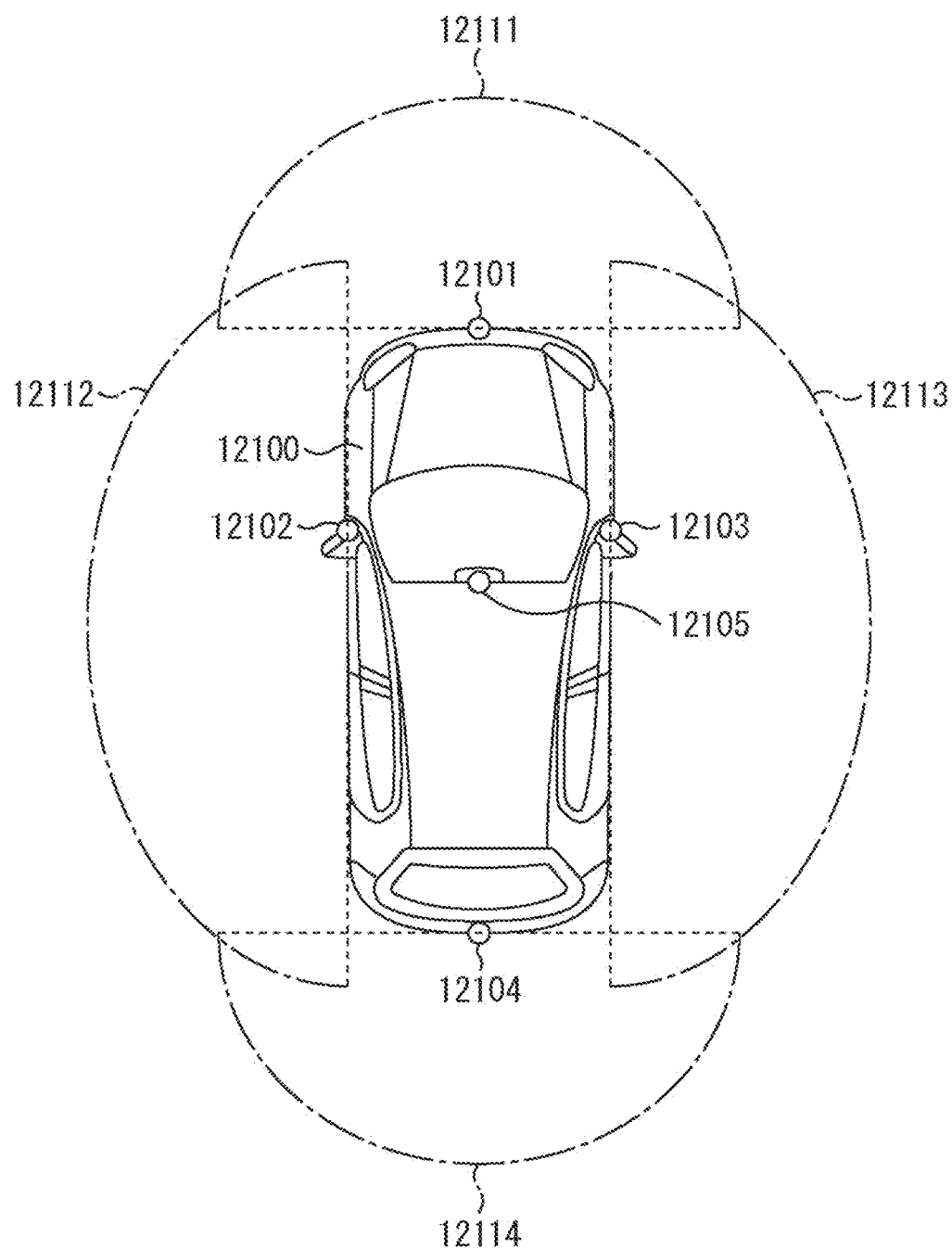
FIG. 31 is an explanatory diagram illustrating an example of installation positions of a vehicle surrounding information detection unit and an imaging unit.

In FIG. 31, the vehicle 12100 includes imaging units 12101, 12102, 12103, 12104, and 12105 as the imaging unit 12031.

Imaging units 12101, 12102, 12103, 12104, and 12105 are positioned, for example, at the front nose, a side mirror, the rear bumper, the back door, and the upper part of the windshield in the vehicle compartment of a vehicle 12100.

The imaging unit 12101 attached to the front nose and the imaging unit 12105 attached to the upper part of the windshield in the vehicle compartment chiefly acquire images of the area ahead of the vehicle 12100. The imaging units 12102 and 12103 attached to the side mirrors chiefly acquire images of the areas on the sides of the vehicle 12100. The imaging unit 12104 attached to the rear bumper or the back door chiefly acquires images of the area behind the vehicle 12100. A front image acquired by the imaging units 12101 and 12105 is used chiefly to detect a preceding vehicle, a pedestrian, an obstacle, a traffic light, a traffic sign, a lane, or the like.

Additionally, FIG. 31 illustrates an example of the imaging ranges of the imaging units 12101 to 12104. An imaging range 12111 represents the imaging range of the imaging unit 12101 attached to the front nose. Imaging ranges 12112 and 12113 respectively represent the imaging ranges of the imaging units 12102 and 12103 attached to the side mirrors. An imaging range 12114 represents the imaging range of the imaging unit 12104 attached to the rear bumper or the back door. For example, overlaying image data captured by the imaging units 12101 to 12104 offers an overhead image that looks down on the vehicle 12100.

At least one of the imaging units 12101 to 12104 may have a function of acquiring distance information. For example, at least one of the imaging units 12101 to 12104 may be a stereo camera including a plurality of image sensors or may be an image sensor that includes pixels for phase difference detection.

For example, the microcomputer 12051 can extract a 3-dimensional object traveling at a predetermined speed (for example, 0 or more km/h) in substantially the same direction as the vehicle 12100 as a preceding vehicle by particularly using a closest 3-dimensional object on a travel road of the vehicle 12100 by obtaining a distance to each 3-dimensional object within the imaging ranges 12111 to 12114 and a temporal change in the distance (a relative speed to the vehicle 12100) on the basis of distance information obtained from the imaging units 12101 to 12104. Further, the microcomputer 12051 can set an inter-vehicle distance to be ensured in advance before a preceding vehicle and perform automatic brake control (also including follow-up stop control) or automatic acceleration control (also including follow-up oscillation control). In this way, it is possible to perform cooperative control for the purpose of automatic driving or the like that allows the vehicle to autonomously travel irrespective of any operation of a driver.

For example, the microcomputer 12051 can classify and extract 3-dimensional object data regarding 3-dimensional objects as other 3-dimensional objects such as motorcycles, normal vehicles, large vehicles, pedestrians, and electric poles on the basis of the distance information obtained from the imaging units 12101 to 12104 and can use the other 3-dimensional objects to automatically avoid obstacles. For example, the microcomputer 12051 identifies obstacles around the vehicle 12100 as obstacles which can be viewed by a driver of the vehicle 12100 and obstacles which are difficult to view. Then, the microcomputer 12051 can determine a collision risk indicating a danger of collision with each obstacle and output a warning to the driver via the audio speaker 12061 or the display unit 12062 in a situation in which there is a collision possibility since the collision risk is set to be equal to or greater than a set value or can perform driving assistance for collision avoidance by performing forced deceleration or avoidance steering iv via the drive line control unit 12010.

At least one of the imaging units 12101 to 12104 may be an infrared camera that detects infrared light. For example, the microcomputer 12051 can recognize a pedestrian by determining whether or not there is the pedestrian in captured images of the imaging units 12101 to 12104. The pedestrian can be recognized, for example, in a procedure in which feature points are extracted in the captured images of the imaging units 12101 to 12104 serving as infrared cameras and a procedure in which a series of feature points indicating a contour of an object are subjected to a pattern matching process to determine whether or not there is the pedestrian. The microcomputer 12051 determines that there is the pedestrian in the captured images of the imaging units 12101 to 12104. When the pedestrian is recognized, the audio and image output unit 12052 controls the display unit 12062 such that a rectangular contour line for emphasis is superimposed to be displayed on the recognized pedestrian. In addition, the audio and image output unit 12052 controls the display unit 12062 such that an icon or the like indicating the pedestrian is displayed at a desired position.

An example of the vehicle control system to which the technology according to the present disclosure can be applied has been described above. The technology according to the present disclosure can be applied to the imaging unit 12031 or the like within the above-described configuration. Specifically, for example, the described-above image sensor 102 can be applied to the imaging unit 12031. Thus, when monitoring processing is performed during parking on the basis of an image pictured by the imaging unit 12031 in order to prevent a thief of a vehicle, or the like, for example, it is possible to achieve power saving by switching the sensing mode and the normal mode. In addition, when an event is detected on the areas around the vehicle, it is possible to image a high-resolution image from the first frame through the appropriate exposure.

Moreover, embodiments of the present technology are not limited to the above-described embodiments, but various changes can be made within the scope of the present technology without departing from the gist of the present technology.

<Combination Examples of Configurations>

Additionally, the present technology may also be configured as below.

(1)

An image sensor including:

a pixel array portion in which a plurality of pixels are disposed and which generates a pixel signal;

a reference signal generation unit configured to generate a reference signal for calibration;

an analog digital (AD) conversion unit configured to execute AD conversion on the pixel signal and the reference signal to generate pixel data and reference data; and a correction processing unit configured to correct the pixel data on a basis of the reference data.

(2)

The image sensor according to (1), in which the correction processing unit includes a correction function generation unit configured to generate a correction function on the basis of the reference data, and a correction unit configured to correct the pixel data on a basis of the correction function.

(3)

The image sensor according to (2), in which the correction function generation unit generates the correction function on a basis of a reference signal characteristic indicating a correspondent relation between an amount of incident light of the pixels and the reference signal and a measurement result of the reference data with regard to the reference signal with a predetermined level.

(4)

The image sensor according to (3), in which the correction processing unit further includes a reference signal characteristic estimation unit configured to estimate the reference signal characteristic on a basis of a light amount characteristic indicating a relation between the amount of incident light of the pixels and the pixel data and the measurement result of the reference data with regard to the reference signal with the predetermined level.

(5)

The image sensor according to (4), in which the correction processing unit further includes a light amount characteristic estimation unit configured to estimate the light amount characteristic on a basis of a measurement result of the pixel data with respect to a predetermined amount of incident light.

(6)

The image sensor according to any one of (2) to (5), in which the correction function generation unit updates the correction function on the basis of the reference data whenever a predetermined condition is satisfied.

(7)

The image sensor according to any one of (2) to (6), in which the correction function is a function of correcting a variation, between the pixels, in a light amount characteristic indicating a relation between an amount of incident light of the pixels and the pixel data.

(8)

The image sensor according to (1), further including:

an analog signal processing unit configured to execute analog signal processing on the pixel signal and the reference signal, in which the AD conversion unit executes the AD conversion on the pixel signal and the reference signal subjected to the analog signal processing.

(9)

The image sensor according to (8), in which the analog signal processing includes a logarithmic conversion process for the pixel signal and the reference signal, and the correction processing unit includes a correction function generation unit configured to generate a correction function of correcting a relation between an amount of incident light of the pixels and the pixel data to a linear relation on the basis of the reference data, and a correction unit configured to correct the pixel data on a basis of the correction function.

(10)

The image sensor according to (1), further including:

a mode control unit configured to set a first driving mode and a second driving mode in which the pixel signal output from the pixel array portion is reduced more than in the first driving mode, in which the correction processing unit corrects the pixel data on the basis of the reference data during the second driving mode.

(11)

The image sensor according to (10), in which the correction processing unit includes a correction function generation unit configured to generate a correction function on the basis of the reference data during the second driving mode, and a correction unit configured to correct the pixel data on a basis of the correction function during the second driving mode.

(12)

The image sensor according to (11), in which the correction function generation unit updates the correction function on the basis of the reference data whenever a predetermined condition is satisfied during the second driving mode.

(13)

The image sensor according to any one of (10) to (12), further including:

an exposure control unit configured to control exposure in the first driving mode on a basis of the corrected pixel data.

(14)

The image sensor according to (13), in which the exposure control unit controls the exposure before the second driving mode transitions to the first driving mode.

(15)

The image sensor according to any one of (10) to (14), in which the mode control unit sets the first driving mode in a case in which a predetermined event is detected on a basis of the corrected pixel data in the second driving mode.

(16)

The image sensor according to any one of (10) to (15), in which the pixel signal obtained by adding signals from a plurality of the pixels is generated in the second driving mode.

(17)

The image sensor according to any one of (10) to (15), in which the pixels outputting the pixel signal are reduced in the second driving mode.

(18)

A signal processing device including:

a correction processing unit configured to correct pixel data obtained when an analog digital (AD) conversion unit executes AD conversion on a pixel signal generated by a pixel array portion in which a plurality of pixels are disposed, on a basis of reference data obtained when the AD conversion unit executes the AD conversion on a reference signal for calibration.

(19)

A signal processing method including:

correcting pixel data obtained when an analog digital (AD) conversion unit executes AD conversion on a pixel signal generated by a pixel array portion in which a plurality of pixels are disposed, on a basis of reference data obtained when the AD conversion unit executes the AD conversion on a reference signal for calibration.

(20)

An electronic device including:

an image sensor; and a signal processing unit configured to process a signal output from the image sensor, in which the image sensor includes a pixel array portion in which a plurality of pixels are disposed and which generates a pixel signal, a reference signal generation unit configured to generate a reference signal for calibration, an analog digital (AD) conversion unit configured to execute AD conversion on the pixel signal and the reference signal to generate pixel data and reference data, and a correction processing unit configured to correct the pixel data on a basis of the reference data.

Note that the effects described in the present specification are merely examples, and not limitative; other effects may be exhibited.

REFERENCE SIGNS LIST 100 imaging device
101 optical unit
102 image sensor
103 DSP circuit
201 pixel array portion
202 control unit
203 row scanning circuit
204 reference signal generation unit
205 input control unit
206 analog signal processing unit
207 AD conversion unit
208 column scanning circuit
209 digital signal processing unit
301 pixel
311 logarithmic conversion circuit
312 voltage conversion circuit
321 ADC
401 input control unit
402 correction processing unit
403 event detection unit
404 mode control unit
405 exposure control unit
406 image processing unit
411 calibration unit
412 correction unit
421 light amount characteristic estimation unit
422 reference signal characteristic estimation unit
423 correction function generation unit
501 temperature detection element
511 thermal array portion
PB pixel block

The invention claimed is:

1. An image sensor comprising:
a pixel array in which a plurality of pixels are disposed and which generates a pixel signal;
a reference signal generator configured to generate a reference signal for calibration;
an analog digital (AD) conversion circuit configured to execute AD conversion on the pixel signal and the reference signal to generate pixel data and reference data; and
correction processing circuitry configured to correct the pixel data on a basis of the reference data, wherein the correction processing circuitry is configured to
generate a correction function on the basis of the reference data and on a basis of a reference signal characteristic indicating a correspondent relation between an amount of incident light of the pixels and the reference signal and a measurement result of the reference data with regard to the reference signal with a predetermined level, and
correct the pixel data on a basis of the correction function.

2. The image sensor according to claim 1, wherein the correction processing circuitry is further configured to
estimate the reference signal characteristic on a basis of a light amount characteristic indicating a relation between the amount of incident light of the pixels and the pixel data and the measurement result of the reference data with regard to the reference signal with the predetermined level.

3. The image sensor according to claim 2, wherein the correction processing circuitry is further configured to
estimate the light amount characteristic on a basis of a measurement result of the pixel data with respect to a predetermined amount of incident light.

4. The image sensor according to claim 1, wherein the correction processing circuitry is configured to update the correction function on the basis of the reference data whenever a predetermined condition is satisfied.

5. The image sensor according to claim 1, wherein the correction function is a function of correcting a variation, between the pixels, in a light amount characteristic indicating a relation between an amount of incident light of the pixels and the pixel data.

6. The image sensor according to claim 1, further comprising:
an analog signal processing circuit configured to execute analog signal processing on the pixel signal and the reference signal,
wherein the AD conversion circuit is configured to execute the AD conversion on the pixel signal and the reference signal subjected to the analog signal processing.

7. An image sensor comprising:
a pixel array in which a plurality of pixels are disposed and which generates a pixel signal;
a reference signal generator configured to generate a reference signal for calibration;
an analog digital (AD) conversion circuit configured to execute AD conversion on the pixel signal and the reference signal to generate pixel data and reference data;
correction processing circuitry configured to correct the pixel data on a basis of the reference data; and
an analog signal processing circuit configured to execute analog signal processing on the pixel signal and the reference signal,
wherein the AD conversion circuit is configured to execute the AD conversion on the pixel signal and the reference signal subjected to the analog signal processing,
wherein the analog signal processing includes a logarithmic conversion process for the pixel signal and the reference signal, and
the correction processing circuitry is configured to
generate a correction function of correcting a relation between an amount of incident light of the pixels and the pixel data to a linear relation on the basis of the reference data, and
correct the pixel data on a basis of the correction function.

8. An image sensor comprising:
a pixel array in which a plurality of pixels are disposed and which generates a pixel signal;
a reference signal generator configured to generate a reference signal for calibration;
an analog digital (AD) conversion circuit configured to execute AD conversion on the pixel signal and the reference signal to generate pixel data and reference data;
correction processing circuitry configured to correct the pixel data on a basis of the reference data; and
mode control circuitry configured to set a first driving mode and a second driving mode in which the pixel signal output from the pixel array is reduced more than in the first driving mode,
wherein the correction processing circuitry is configured to correct the pixel data on the basis of the reference data during the second driving mode.

9. The image sensor according to claim 8, wherein the correction processing circuitry is configured to generate a correction function on the basis of the reference data during the second driving mode, and correct the pixel data on a basis of the correction function during the second driving mode.

10. The image sensor according to claim 9, wherein the correction processing circuitry is configured to update the correction function on the basis of the reference data whenever a predetermined condition is satisfied during the second driving mode.

11. The image sensor according to claim 8, further comprising:

exposure control circuitry configured to control exposure in the first driving mode on a basis of the corrected pixel data.

12. The image sensor according to claim 11, wherein the exposure control circuitry is configured to control the exposure before the second driving mode transitions to the first driving mode.

13. The image sensor according to claim 8, wherein the mode control circuitry is configured to set the first driving mode in a case in which a predetermined event is detected on a basis of the corrected pixel data in the second driving mode.

14. The image sensor according to claim 8, wherein the pixel signal obtained by adding signals from a plurality of the pixels is generated in the second driving mode.

15. The image sensor according to claim 8, wherein the pixels outputting the pixel signal are reduced in the second driving mode.

16. A signal processing device comprising:

correction processing circuitry configured to correct pixel data obtained when an analog digital (AD) conversion circuit executes AD conversion on a pixel signal generated by a pixel array in which a plurality of pixels are disposed, on a basis of reference data obtained when the AD conversion unit executes the AD conversion on a reference signal for calibration, wherein the correction processing circuitry is configured to generate a correction function on the basis of the reference data and on a basis of a reference signal characteristic indicating a correspondent relation between an amount of incident light of the pixels and the reference signal and a measurement result of the reference data with regard to the reference signal with a predetermined level, and correct the pixel data on a basis of the correction function.

17. A signal processing method comprising:

correcting pixel data obtained when an analog digital (AD) conversion circuit executes AD conversion on a pixel signal generated by a pixel array in which a plurality of pixels are disposed, on a basis of reference data obtained when the AD conversion unit executes the AD conversion on a reference signal for calibration, wherein correcting pixel data includes generating a correction function on the basis of the reference data and on a basis of a reference signal characteristic indicating a correspondent relation between an amount of incident light of the pixels and the reference signal and a measurement result of the reference data with regard to the reference signal with a predetermined level; and correcting the pixel data on a basis of the correction function.

18. An electronic device comprising:

an image sensor; and signal processing circuitry configured to process a signal output from the image sensor, wherein the image sensor includes a pixel array in which a plurality of pixels are disposed and which generates a pixel signal, a reference signal generator configured to generate a reference signal for calibration, an analog digital (AD) conversion circuit configured to execute AD conversion on the pixel signal and the reference signal to generate pixel data and reference data, and correction processing circuitry configured to correct the pixel data on a basis of the reference data, wherein the correction processing circuitry is configured to generate a correction function on the basis of the reference data and on a basis of a reference signal characteristic indicating a correspondent relation between an amount of incident light of the pixels and the reference signal and a measurement result of the reference data with regard to the reference signal with a predetermined level, and correct the pixel data on a basis of the correction function.

* * * * *